US008516343B2

(12) United States Patent
Flynn et al.

(10) Patent No.: US 8,516,343 B2
(45) Date of Patent: Aug. 20, 2013

(54) APPARATUS, SYSTEM, AND METHOD FOR RETIRING STORAGE REGIONS

(75) Inventors: David Flynn, Sandy, UT (US); Jonathan Thatcher, Liberty Lake, WA (US); Edward Shober, West Jordan, UT (US)

(73) Assignee: Fusion-io, Inc., Salt Lake City, UT (US)

( * ) Notice: Subject to any disclaimer, the term of this patent is extended or adjusted under 35 U.S.C. 154(b) by 513 days.

(21) Appl. No.: 12/616,124

(22) Filed: Nov. 10, 2009

(65) Prior Publication Data

US 2010/0122148 A1 May 13, 2010

Related U.S. Application Data

(60) Provisional application No. 61/112,955, filed on Nov. 10, 2008.

(51) Int. Cl.
*G11C 29/00* (2006.01)

(52) U.S. Cl.
USPC ........................................................ 714/773

(58) Field of Classification Search
USPC ............ 714/6.1, 6.2, 6.24, 25, 42, 47.1, 47.2, 714/47.3, 718, 763, 764, 773, 721, 6.13; 711/100, 102–104; 365/185.09, 185.24, 365/185.33
See application file for complete search history.

(56) References Cited

U.S. PATENT DOCUMENTS

| 5,715,193 | A | * | 2/1998 | Norman | 365/185.02 |
| 5,831,989 | A | | 11/1998 | Fujisaki | |
| 5,854,796 | A | | 12/1998 | Sato | |
| 6,014,755 | A | * | 1/2000 | Wells et al. | 714/6.13 |
| 6,034,831 | A | * | 3/2000 | Dobbek et al. | 360/53 |
| 6,188,619 | B1 | | 2/2001 | Jung | |
| 6,725,321 | B1 | * | 4/2004 | Sinclair et al. | 711/103 |
| 7,272,755 | B2 | | 9/2007 | Smith | |
| 7,349,254 | B2 | * | 3/2008 | Prasad | 365/185.09 |

(Continued)

FOREIGN PATENT DOCUMENTS

WO 2010/054410 5/2010

OTHER PUBLICATIONS

ASPMC_660, Asine Group, http://www.asinegroup.com/products/aspmc660.html, copyright 2002, downloaded on Nov. 18, 2009.

(Continued)

*Primary Examiner* — Scott Baderman
*Assistant Examiner* — Joseph Kudirka
(74) *Attorney, Agent, or Firm* — Jeffrey T. Holman

(57) ABSTRACT

Apparatuses, systems, and methods are disclosed for retiring storage regions. A determination module (a) determines that data stored in an Error Correcting Code ("ECC") chunk contains ECC correctable errors, and (b) determines a bit error count for the ECC chunk. The ECC chunk is read from non-volatile solid-state storage media. A threshold module determines if the bit error count satisfies an ECC chunk error threshold. A storage region error module determines if a storage region that contains at least a portion of the ECC chunk satisfies region retirement criteria. The storage region may include a first portion on a first solid-state storage die and a second portion on a second solid-state storage die. A retirement module retires the storage region, including the first portion and the second portion in parallel, in response to the storage region containing at least a portion of the ECC chunk and satisfying the region retirement criteria.

32 Claims, 11 Drawing Sheets

(56) References Cited

U.S. PATENT DOCUMENTS

| | | | |
|---|---|---|---|
| 7,623,365 B2 * | 11/2009 | Jeddeloh | 365/63 |
| 7,765,426 B2 * | 7/2010 | Li | 714/6.13 |
| 8,195,978 B2 * | 6/2012 | Flynn et al. | 714/6.1 |
| 8,341,335 B2 * | 12/2012 | Weingarten et al. | 711/103 |
| 2001/0052093 A1 | 12/2001 | Oshima et al. | |
| 2002/0108016 A1 | 8/2002 | Haines et al. | |
| 2003/0204788 A1 | 10/2003 | Smith | |
| 2004/0073829 A1 | 4/2004 | Olarig | |
| 2005/0005191 A1 | 1/2005 | Judd | |
| 2005/0091452 A1 | 4/2005 | Chen et al. | |
| 2006/0085670 A1 | 4/2006 | Carver et al. | |
| 2007/0006048 A1 | 1/2007 | Zimmer et al. | |
| 2007/0106870 A1 | 5/2007 | Bonwick et al. | |
| 2007/0118713 A1 | 5/2007 | Guterman et al. | |
| 2007/0245068 A1 * | 10/2007 | Yero | 711/103 |
| 2007/0255889 A1 * | 11/2007 | Yogev et al. | 711/103 |
| 2007/0266276 A1 | 11/2007 | Gatzemeier et al. | |
| 2008/0010566 A1 * | 1/2008 | Chang et al. | 714/718 |
| 2008/0120518 A1 | 5/2008 | Ritz et al. | |
| 2008/0141043 A1 | 6/2008 | Flynn et al. | |
| 2008/0244368 A1 | 10/2008 | Chin et al. | |
| 2009/0089603 A1 * | 4/2009 | Ding et al. | 713/340 |

OTHER PUBLICATIONS

BiTMICRO Introduces E-Disk PMC Flash Disk Module at Military & Aerospace Electronics East, May 18, 2004, BiTMICRO, http://www.bitmicro.com/press_news_releases_20040518_prt.php.

NAND Flash 101: An Introduction to NAND Flash and How to Design It in to Your Next Product, Micron, pp. 1-28, Micron Technology Nov. 2006.

PCT/US2009/063938, International Search Report and Written Opinion, Jun. 23, 2010.

PCT/US2009/063938, International Preliminary Report of Patentability, May 19, 2011.

"Bad Block Management in Single Level Cell NAND Flash Memories", STMicroelectronics, 2004, pp. 1-7, www.st.com.

"ECC Algorithm", Flash Planing Group Memory Division Samsung Electronics Co., Ltd., pp. 1-8, ecc_algorithm_for_web_512b_March_2005.pdf= http://www.samsung.com/global/business/semiconductor/products/flash/FlashApplicationNote.html.

* cited by examiner

APPARATUS, SYSTEM, AND METHOD FOR RETIRING STORAGE REGIONS

CROSS-REFERENCE TO RELATED APPLICATIONS

This application claims priority to U.S. Provisional Patent Application No. 61/112,955 entitled "APPARATUS, SYSTEM, AND METHOD FOR PREDICTING ERRORS IN SOLID-STATE STORAGE" and filed on Nov. 10, 2008 for David Flynn, et al., which is incorporated herein by reference.

FIELD OF THE INVENTION

This invention relates to handling data errors and more particularly relates to determining when to retire a storage region in solid-state storage and when a storage region retirement rate reaches an unacceptable level.

BACKGROUND

Solid-state storage and other data storage media may have data errors that may cause data to be compromised. To overcome data errors and to avoid data loss, Error Correcting Code ("ECC") techniques may be used to protect data. ECC algorithms operate on data and are used to generate ECC, which is typically stored and linked to the data used to generate the ECC. Often manufactures will use extra bits in a memory address to store ECC. For example, a memory bus may be 72 bits wide with 64 bits dedicated to data and 8 bits dedicated to the ECC generated from the 64 bits of data. Typically the 72 bits will be stored together in a row within the memory. Each row will typically then have 8 bits for ECC.

ECC techniques can not only detect bit errors but can correct bit errors as well. When data is read, the ECC stored with the data is used by an ECC algorithm to detect and correct bit errors. The ECC algorithm used on a data read is complimentary to the ECC algorithm used to generate the ECC. Typically, an ECC algorithm can correct less bits than bit errors that the same ECC algorithm can detect. The number of bit errors detected within a set of data bits is typically called a bit error count.

Certain non-volatile solid-state storage is susceptible to errors. Current error detection techniques fail to identify and retire or remove from use storage elements before they experience uncorrectable errors.

SUMMARY

Apparatuses are presented to determine non-volatile solid-state storage media status. A determination module is configured to (a) determine that data stored in an Error Correcting Code ("ECC") chunk contains ECC correctable errors and (b) further determine a bit error count for the ECC chunk. The ECC chunk is read from non-volatile solid-state storage media. A threshold module is configured to determine if the bit error count satisfies an ECC chunk error threshold. A storage region error module is configured to determine if a storage region that contains at least a portion of the ECC chunk satisfies region retirement criteria. In one embodiment, the storage region may include a first portion on a first solid-state storage die and a second portion on a second solid-state storage die. A retirement module is configured to retire the storage region, including the first portion and the second portion in parallel, in response to the storage region containing at least a portion of the ECC chunk and satisfying the region retirement criteria.

Methods are presented for determining solid-state storage device status. A method includes determining that data stored in an ECC chunk contains ECC correctable errors and determining a bit error count for the ECC chunk. The ECC chunk is read from non-volatile solid-state storage media. A method includes determining if the bit error count satisfies an ECC chunk error threshold, and determining if a storage region that contains at least a portion of the ECC chunk satisfies region retirement criteria. In one embodiment, the storage region may comprise a first portion on a first solid-state storage die and a second portion on a second solid-state storage die. A method includes retiring the storage region, including the first portion and the second portion together, in response to the storage region containing at least a portion of the ECC chunk and satisfying the region retirement criteria.

Other apparatuses are presented for retiring a storage region. An error module is configured to determine that a storage region has one or more data errors. The storage region includes non-volatile solid-state storage.

A storage region error module is configured to determine if a storage region determined to have one or more data errors by the error module satisfies region retirement criteria. A retirement module is configured to retire the storage region in response to the storage region satisfying the region retirement criteria. A verification module is configured to verify that a previously retired storage region is suitable for data storage and allow re-use of the previously retired storage region.

Another apparatus is presented. A determination module is configured to identify Error Correcting Code ("ECC") correctable bit errors in storage regions of a solid-state storage medium. A disturb counter module is configured to track storage operations performed on the storage regions. A storage region retirement module is configured to retire a storage region of the solid-state storage medium based at least in part on bit errors identified within the storage region and a disturb count of storage regions adjacent to the storage region.

Another apparatus is presented. A retirement module is configured to retire a storage region of a solid-state storage medium in response to determining that the storage region satisfies a region retirement threshold. A verification module is configured to verify that the retired storage region is suitable for data storage and to allow reuse of the retired storage region.

Another apparatus is presented. A retirement module is configured to retire a storage region of a solid-state storage medium in response to determining that the storage region satisfies a region retirement threshold. A media error prediction module is configured to monitor a storage region retirement rate. In one embodiment, the storage region retirement rate may include a ratio of a number of storage regions retired per unit of time.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussion of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize that the invention may be practiced without one or more of the specific features or advantages of a particular embodiment. In other instances, additional features and advantages may be recognized in certain embodiments that may not be present in all embodiments of the invention.

These features and advantages of the present invention will become more fully apparent from the following description and appended claims, or may be learned by the practice of the invention as set forth hereinafter.

BRIEF DESCRIPTION OF THE DRAWINGS

In order that the advantages of the invention will be readily understood, a more particular description of the invention briefly described above will be rendered by reference to specific embodiments that are illustrated in the appended drawings. Understanding that these drawings depict only typical embodiments of the invention and are not therefore to be considered to be limiting of its scope, the invention will be described and explained with additional specificity and detail through the use of the accompanying drawings, in which.

DETAILED DESCRIPTION

Figure 1:
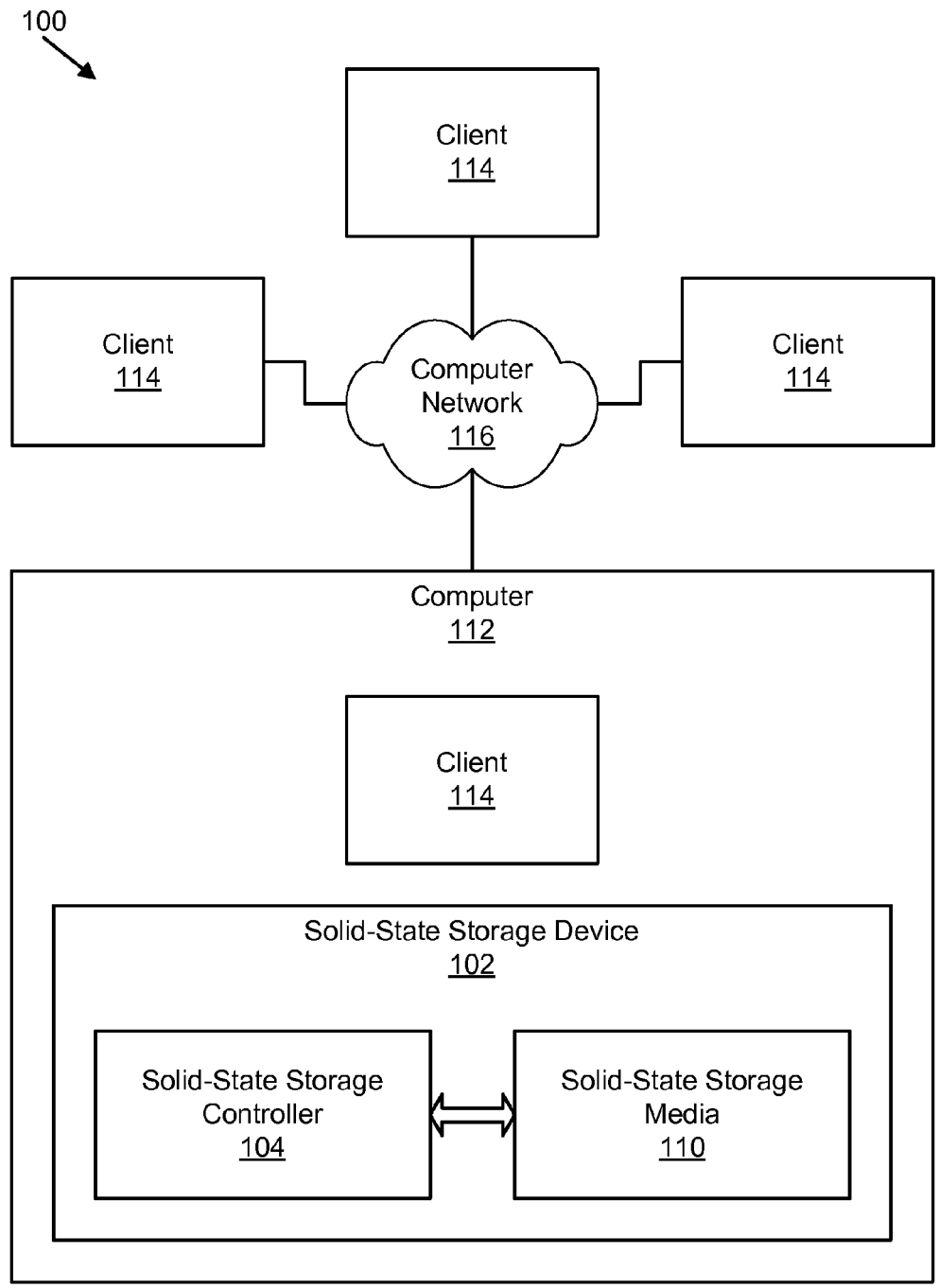
FIG. 1 is a schematic block diagram illustrating one embodiment of a system for predicting failures in solid-state storage in accordance with the present invention.

Many of the functional units described in this specification have been labeled as modules, in order to more particularly emphasize their implementation independence. For example, a module may be implemented as a hardware circuit comprising custom VLSI circuits or gate arrays, off-the-shelf semiconductors such as logic chips, transistors, or other discrete components. A module may also be implemented in programmable hardware devices such as field programmable gate arrays, programmable array logic, programmable logic devices or the like.

Modules may also be implemented in software for execution by various types of processors. An identified module of executable code may, for instance, comprise one or more physical or logical blocks of computer instructions which may, for instance, be organized as an object, procedure, or function. Nevertheless, the executables of an identified module need not be physically located together, but may comprise disparate instructions stored in different locations which, when joined logically together, comprise the module and achieve the stated purpose for the module.

Indeed, a module of executable code may be a single instruction, or many instructions, and may even be distributed over several different code segments, among different programs, and across several memory devices. Similarly, operational data may be identified and illustrated herein within modules, and may be embodied in any suitable form and organized within any suitable type of data structure. The operational data may be collected as a single data set, or may be distributed over different locations including over different storage devices. Where a module or portions of a module are implemented in software, the software portions are stored on one or more computer readable media.

Reference throughout this specification to "one embodiment," "an embodiment," or similar language means that a particular feature, structure, or characteristic described in connection with the embodiment is included in at least one embodiment of the present invention. Thus, appearances of the phrases "in one embodiment," "in an embodiment," and similar language throughout this specification may, but do not necessarily, all refer to the same embodiment.

Reference to a computer readable medium may take any form capable of storing machine-readable instructions on a digital processing apparatus. A computer readable medium may be embodied by a compact disk, digital-video disk, a magnetic tape, a Bernoulli drive, a magnetic disk, a punch card, flash memory, integrated circuits, or other digital processing apparatus memory device.

Furthermore, the described features, structures, or characteristics of the invention may be combined in any suitable manner in one or more embodiments. In the following description, numerous specific details are provided, such as examples of programming, software modules, user selections, network transactions, database queries, database structures, hardware modules, hardware circuits, hardware chips, etc., to provide a thorough understanding of embodiments of the invention. One skilled in the relevant art will recognize, however, that the invention may be practiced without one or more of the specific details, or with other methods, components, materials, and so forth. In other instances, well-known structures, materials, or operations are not shown or described in detail to avoid obscuring aspects of the invention.

The schematic flow chart diagrams included herein are generally set forth as logical flow chart diagrams. As such, the depicted order and labeled steps are indicative of one embodiment of the presented method. Other steps and methods may be conceived that are equivalent in function, logic, or effect to one or more steps, or portions thereof, of the illustrated method. Additionally, the format and symbols employed are provided to explain the logical steps of the method and are understood not to limit the scope of the method. Although various arrow types and line types may be employed in the flow chart diagrams, they are understood not to limit the scope of the corresponding method. Indeed, some arrows or other connectors may be used to indicate only the logical flow of the method. For instance, an arrow may indicate a waiting or monitoring period of unspecified duration between enumerated steps of the depicted method. Additionally, the order in which a particular method occurs may or may not strictly adhere to the order of the corresponding steps shown.

Solid-State Storage System

FIG. 1 is a schematic block diagram illustrating one embodiment of a system 100 for predicting failures in solid-state storage in accordance with the present invention. The system 100 includes a solid-state storage device 102, a solid-state storage controller 104, a solid-state storage media 110, a computer 112, one or more a clients 114, and a computer network 116, which are described below.

The system 100 includes at least one solid-state storage device 102. In another embodiment, the system 100 includes two or more solid-state storage devices 102. Each solid-state storage device 102 may include non-volatile, solid-state storage media 110, such as flash memory, nano random access memory ("nano RAM or NRAM"), magneto-resistive RAM ("MRAM"), dynamic RAM ("DRAM"), phase change RAM ("PRAM"), etc. The solid-state storage device 102 is described in more detail with respect to FIG. 2. The solid-state storage device 102 is depicted in a computer 112 connected to a client 114 through a computer network 116. In one embodiment, the computer 112 includes at least one client 114. The client 114 in the computer 112 may be an application, a server, such as a file server, or other program running on operating system of the computer 112.

In one embodiment, the solid-state storage device 102 is internal to the computer 112 and is connected using a system bus, such as a peripheral component interconnect express ("PCI-e") bus, a Serial Advanced Technology Attachment ("serial ATA") bus, or the like. In another embodiment, the solid-state storage device 102 is external to the computer 112 and is connected, a universal serial bus ("USB") connection, an Institute of Electrical and Electronics Engineers ("IEEE") 1394 bus ("FireWire"), or the like. In other embodiments, the solid-state storage device 102 is connected to the computer 112 using a peripheral component interconnect ("PCI") express bus using external electrical or optical bus extension or bus networking solution such as Infiniband or PCI Express Advanced Switching ("PCIe-AS"), or the like.

In various embodiments, the solid-state storage device 102 may be in the form of a dual-inline memory module ("DIMM"), a daughter card, or a micro-module. In another embodiment, the solid-state storage device 102 is an element within a rack-mounted blade. In another embodiment, the solid-state storage device 102 is contained within a package that is integrated directly onto a higher level assembly (e.g. mother board, lap top, graphics processor). In another embodiment, individual components comprising the solid-state storage device 102 are integrated directly onto a higher level assembly without intermediate packaging. The solid-state storage device 102 includes one or more solid-state storage controllers 104 and each includes a solid-state storage media 110, which is described in more detail below with respect to FIG. 2.

The system 100 includes one or more computers 112 connected to the solid-state storage device 102. A computer 112 may be a host, a server, a blade, a storage controller of a storage area network ("SAN"), a workstation, a personal computer, a laptop computer, a handheld computer, a supercomputer, a computer cluster, a network switch, router, or appliance, a database or storage appliance, a data acquisition or data capture system, a diagnostic system, a test system, a robot, a portable electronic device, a wireless device, or the like. In another embodiment, a computer 112 may be a client and the solid-state storage device 102 operates autonomously to service data requests sent from the computer 112. In this embodiment, the computer 112 and solid-state storage device 102 may be connected using a computer network, system bus, or other communication means suitable for connection between a computer 112 and an autonomous solid-state storage device 102.

In one embodiment, the system 100 includes one or more clients 114 connected to one or more computer 112 through one or more computer networks 116. A client 114 may be a host, a server, a storage controller of a SAN, a workstation, a personal computer, a laptop computer, a handheld computer, a supercomputer, a computer cluster, a network switch, router, or appliance, a database or storage appliance, a data acquisition or data capture system, a diagnostic system, a test system, a robot, a portable electronic device, a wireless device, or the like. The computer network 116 may include the Internet, a wide area network ("WAN"), a metropolitan area network ("MAN"), a local area network ("LAN"), a token ring, a wireless network, a fiber channel network, a SAN, network attached storage ("NAS"), ESCON, or the like, or any combination of networks. The computer network 116 may also include a network from the IEEE 802 family of network technologies, such Ethernet, token ring, WiFi, WiMax, and the like.

The computer network 116 may include servers, switches, routers, cabling, radios, and other equipment used to facilitate networking computers 112 and clients 114. In one embodiment, the system 100 includes multiple computers 112 that communicate as peers over a computer network 116. In another embodiment, the system 100 includes multiple solid-state storage devices 102 that communicate as peers over a computer network 116. One of skill in the art will recognize other computer networks 116 comprising one or more computer networks 116 and related equipment with single or redundant connection between one or more clients 114 or other computer with one or more solid-state storage devices 102 or one or more solid-state storage devices 102 connected to one or more computers 112. In one embodiment, the system 100 includes two or more solid-state storage devices 102 connected through the computer network 116 to a client 114 without a computer 112.

Solid-State Storage Device

Figure 2:
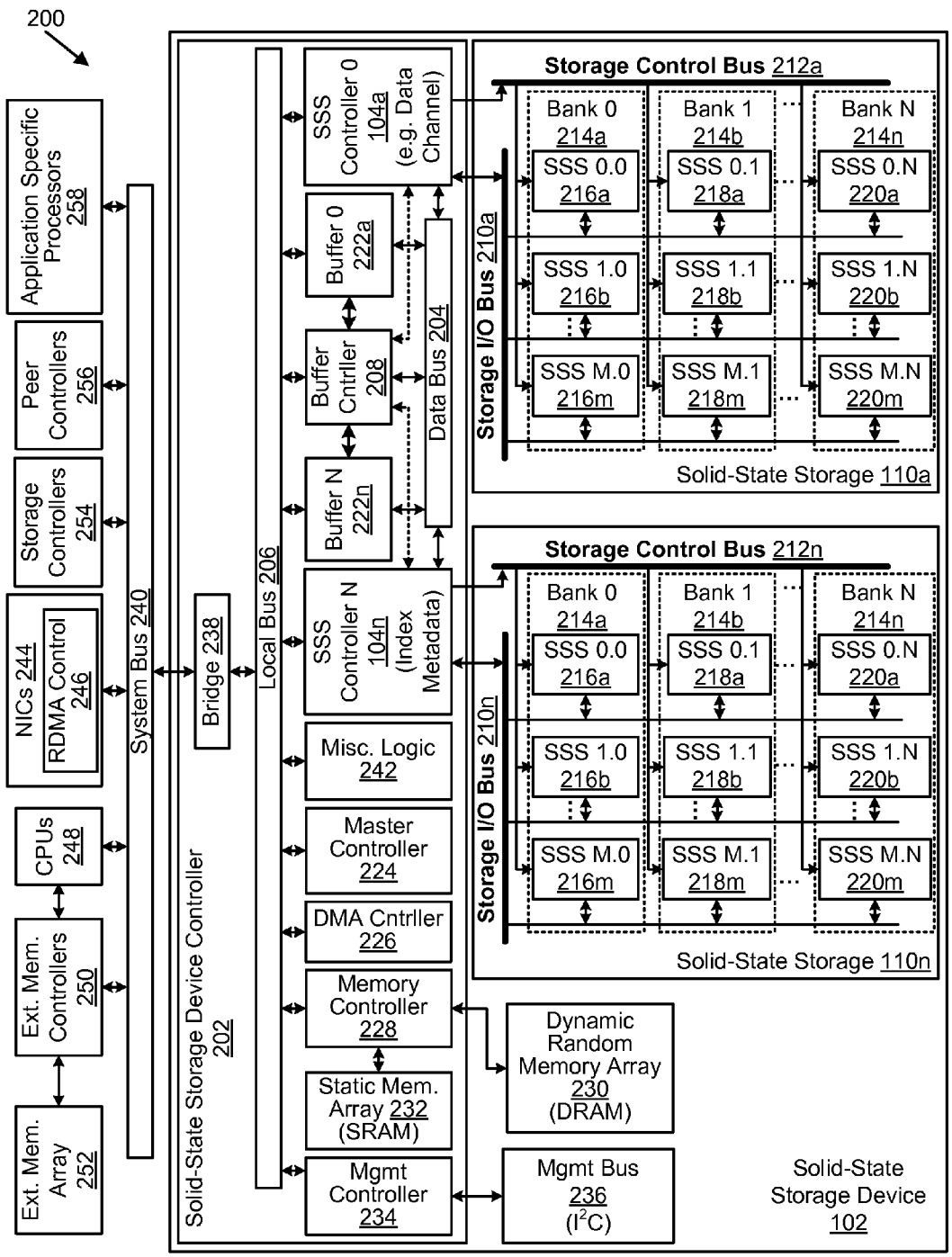
FIG. 2 is a schematic block diagram illustrating one embodiment of a solid-state storage device in accordance with the present invention.

FIG. 2 is a schematic block diagram illustrating one embodiment 201 of a solid-state storage device controller 202 in a solid-state storage device 102 in accordance with the present invention. The solid-state storage device controller 202 may include a number of solid-state storage controllers 0-N 104a-n, each controlling solid-state storage media 110. In the depicted embodiment, two solid-state controllers are shown: solid-state storage controller 0 104a and solid-state storage controller N 104n, and each controls solid-state storage media 110a-n. In the depicted embodiment, solid-state storage controller 0 104a controls a data channel so that the attached solid-state storage media 110a stores data. Solid-state storage controller N 104n controls an index metadata channel associated with the stored data and the associated solid-state storage media 110n stores index metadata. In an alternate embodiment, the solid-state storage device controller 202 includes a single solid-state storage controller 104a with a single solid-state storage media 110a. In another embodiment, there are a plurality of solid-state storage controllers 104a-n and associated solid-state storage media 110a-n. In one embodiment, one or more solid-state storage controllers 104a-104n-1, coupled to their associated solid-state storage media 110a-110n-1, control data while at least one solid-state storage controller 104n, coupled to its associated solid-state storage media 110n, controls index metadata.

In one embodiment, at least one solid-state storage controller 104 is field-programmable gate array ("FPGA") and controller functions are programmed into the FPGA. In a particular embodiment, the FPGA is a Xilinx® FPGA. In another embodiment, the solid-state storage controller 104 comprises components specifically designed as a solid-state storage controller 104, such as an application-specific integrated circuit ("ASIC") or custom logic solution. Each solid-state storage controller 104 typically includes a write data pipeline and a read data pipeline, which are describe further in U.S. patent application Ser. No. 11/952,091 to David Flynn, et al., titled "Apparatus, System, and Method for Managing Data Using a Data Pipeline, filed 6 Dec. 2007, which is incorporated herein by reference. In another embodiment, at least one solid-state storage controller 104 is made up of a combination FPGA, ASIC, and custom logic components.

Solid-State Storage

The solid-state storage media 110, in one embodiment, is a two-dimensional array of non-volatile solid-state storage elements 216, 218, 220, arranged in banks 214, and accessed in parallel through a storage input/output ("I/O") bus 210. In another embodiment, the solid-state storage media 110 is a single solid-state storage element (e.g. 214a) such as a chip. The storage I/O bus 210, in one embodiment, is capable of unidirectional communication at any one time. In another embodiment, data can flow both directions simultaneously.

A solid-state storage element (e.g. SSS 0.0 216a) is typically configured as a chip (a package of one or more dies) or a die on a circuit board. As depicted, a solid-state storage element (e.g. 216a) operates independently or semi-independently of other solid-state storage elements (e.g. 218a) even if these several storage elements 216, 218, 220 are packaged together in a chip package, a stack of chip packages, or some other package element. As depicted, a bank 214 comprises a column of solid-state storage elements 216, 218, 220. As depicted, there may be "n" banks 214a-n and "m" solid-state storage elements 216a-m, 218a-m, 220a-m per bank in an array of n×m solid-state storage elements 216, 218, 220 in a solid-state storage media 110. In one embodiment, a solid-state storage media 110a includes twenty solid-state storage elements per bank (e.g. 216a-m in bank 214a, 218 a-m in bank 214b, 220a-m in bank 214n, where m=22) with eight banks (e.g. 214a-n where n=8) and a solid-state storage media 110n includes 2 solid-state storage elements (e.g. 216a-m where m=2) per bank 214 with one bank 214a. In one embodiment, each solid-state storage element 216a-m, 218a-m, 220a-m is comprised of a single-level cell ("SLC") storage devices. In another embodiment, each solid-state storage element 216a-m, 218a-m, 220a-m is comprised of multi-level cell ("MLC") storage devices.

In one embodiment, solid-state storage elements for multiple banks 214 that share a common storage I/O bus 210a row (e.g. 216b, 218b, 220b) are packaged together. In one embodiment, a solid-state storage element 216, 218, 220 may have one or more dies per chip with one or more chips stacked vertically and each die may be accessed independently. In another embodiment, a solid-state storage element (e.g. SSS 0.0 216a) may have one or more virtual dies per die and one or more dies per chip and one or more chips stacked vertically and each virtual die may be accessed independently. In another embodiment, a solid-state storage element SSS 0.0 216a may have one or more virtual dies per die and one or more dies per chip with some or all of the one or more dies stacked vertically and each virtual die may be accessed independently. An enable, chip select, or other selection line on the storage control bus 212 may be selected to enable data transfer to a single virtual die, die, stacked chip, etc.

In one embodiment, two dies are stacked vertically with four stacks per group to form eight solid-state storage elements (e.g. SSS 0.0-SSS 0.8) 216a-220a, each in a separate bank 214a-n. In another embodiment, 20 storage elements (e.g. SSS 0.0-SSS 20.0) 216 form a virtual bank 214a so that each of the eight virtual banks has 20 solid-state storage elements (e.g. SSS0.0-SSS 20.8) 216, 218, 220. Data is sent to the solid-state storage media 110 over the storage I/O bus 210 to all storage elements of a particular group of solid-state storage elements (SSS 0.0-SSS 0.8) 216a, 218a, 220a. The storage control bus 212a is used to select a particular bank (e.g. bank-0 214a) so that the data received over the storage I/O bus 210 connected to all banks 214 is written just to the selected bank 214a.

In one embodiment, the storage I/O bus 210 is comprised of one or more independent I/O buses ("IIOBa-m" comprising 210a.a-m, 210n.a-m) wherein the solid-state storage elements within each row share one of the independent I/O buses accesses each solid-state storage element 216, 218, 220 in parallel so that all banks 214 are accessed simultaneously. For example, one channel of the storage I/O bus 210 may access a first solid-state storage element 216a, 218a, 220a of each bank 214a-n simultaneously. A second channel of the storage I/O bus 210 may access a second solid-state storage element 216b, 218b, 220b of each bank 214a-n simultaneously. Each row of solid-state storage element 216, 218, 220 is accessed simultaneously. In one embodiment, where solid-state storage elements 216, 218, 220 are multi-level (physically stacked), all physical levels of the solid-state storage elements 216, 218, 220 are accessed simultaneously. As used herein, "simultaneously" also includes near simultaneous access where devices are accessed at slightly different intervals to avoid switching noise. Simultaneously is used in this context is distinguished from sequential or serial access wherein commands and/or data are sent individually one after the other.

Typically, banks 214a-n are independently selected using the storage control bus 212. In one embodiment, a bank 214 is selected using a chip enable or chip select. Where both chip select and chip enable are available, the storage control bus 212 may select one level of a multi-level solid-state storage element 216, 218, 220 using a combination of the chip select and/or chip enable. In other embodiments, other commands are used by the storage control bus 212 to individually select one level of a multi-level solid-state storage element 216, 218, 220. Solid-state storage elements 216, 218, 220 may also be selected through a combination of control and of address information transmitted on storage I/O bus 210 and the storage control bus 212.

In one embodiment, each solid-state storage element 216, 218, 220 is partitioned into erase blocks and each erase block is partitioned into pages. A typical physical page (or simply "page") is 2000 bytes ("2 kB"). In one example, a solid-state storage element (e.g. SSS0.0 216a) includes two registers and can program two pages so that a two-register solid-state storage element 216, 218, 220 has a capacity of 4 kB. A bank 214 of 20 solid-state storage elements 216, 218, 220 would then have an 80 kB capacity of pages accessed with the same address going out the channels of the storage I/O bus 210.

This group of pages in a bank 214 of solid-state storage elements 216, 218, 220 of 80 kB may be called a virtual page. (The terms virtual page and logical page are used interchangeably herein.) Similarly, an erase block of each storage element 216a-m of a bank 214a may be grouped to form a virtual erase block. In one embodiment, an erase block of pages within a solid-state storage element 216, 218, 220 is erased when an erase command is received within a solid-state storage element 216, 218, 220. Whereas the size and number of erase blocks, pages, planes, or other logical and physical divisions within a solid-state storage element 216, 218, 220 are expected to change over time with advancements in technology, it is to be expected that many embodiments consistent with new configurations are possible and are consistent with the general description herein.

Typically, when a packet is written to a particular location within a solid-state storage element 216, 218, 220, wherein the packet is intended to be written to a location within a particular page which is specific to a of a particular erase block of a particular element of a particular bank 214, a physical address is sent on the storage I/O bus 210 and followed by the packet. The physical address contains enough information for the solid-state storage element 216, 218, 220 to direct the packet to the designated location within the page. Since all storage elements in a row of solid-state storage elements (e.g. SSS 0.0-SSS 0.N 216a, 218a, 220a) are accessed simultaneously by the appropriate bus within the storage I/O bus 210a.a, to reach the proper page and to avoid writing the data packet to similarly addressed pages in the row of solid-state storage elements (SSS 0.0-SSS 0.N 216a, 218a, 220a), the bank 214a that includes the solid-state storage element SSS 0.0 216a with the correct page where the data packet is to be written is simultaneously selected by the storage control bus 212.

Similarly, a read command traveling on the storage I/0 bus 210 requires a simultaneous command on the storage control bus 212 to select a single bank 214a and the appropriate page within that bank 214a. In one embodiment, a read command reads an entire page, and because there are multiple solid-state storage elements 216, 218, 220 in parallel in a bank 214, an entire virtual page is read with a read command. However, the read command may be broken into subcommands. A virtual page may also be accessed in a write/program operation. ("Write" and "program" are used interchangeably herein however the terms required for a given context may vary depending on the operations supported by the storage media.)

An erase block erase command may be sent out to erase an erase block over the storage I/O bus 210 with a particular erase block address to erase a particular erase block. Typically, an erase block erase command may be sent over the parallel paths of the storage I/O bus 210 to erase a virtual erase block, each with a particular erase block address to erase a particular erase block. Simultaneously a particular bank (e.g. bank-0 214a) is selected over the storage control bus 212 to prevent erasure of similarly addressed erase blocks in all of the banks (banks 1-N 214b-n). Other commands may also be sent to a particular location using a combination of the storage I/O bus 210 and the storage control bus 212. One of skill in the art will recognize other ways to select a particular storage location using the bi-directional storage I/O bus 210 and the storage control bus 212.

In one embodiment, packets are written sequentially to the solid-state storage media 110. For example, packets are streamed to the storage write buffers of a bank 214a of storage elements 216 and when the buffers are full, the packets are programmed to a designated virtual page. Packets then refill the storage write buffers and, when full, the packets are written to the next virtual page. The next virtual page may be in the same bank 214a or another bank (e.g. 214b). This process continues, virtual page after virtual page, typically until a virtual erase block is filled. In another embodiment, the streaming may continue across virtual erase block boundaries with the process continuing, virtual erase block after virtual erase block.

An object index maintains a mapping between logical identifiers, such as a file name, object identifier, logical block address, or other logical structure, and physical addresses where data is stored in the solid-state storage media 110. In one embodiment, the object index does not map objects, but maps other logical structures. One or more physical addresses are mapped to a logical identifier associated with data received from a client 114 or other requesting device. Object storage and mapping is discussed in more detail in U.S. application Ser. No. 11/952,098 to David Flynn, et al. and titled "Apparatus, System, and Method for Servicing Object Requests Within A Storage Controller," filed 12 Dec. 2007 and U.S. application Ser. No. 12/098,433 to David Flynn, et al. and titled "Apparatus, System, and Method for Converting a Storage Request into an Append Data Storage Command," filed 6 Apr. 2008, and U.S. application Ser. No. 12/098,434 to David Flynn, et al. and titled "Apparatus, System, and Method for Efficient Mapping of Virtual and Physical Addresses," also filed 6 Apr. 2008, which are all herein incorporated by reference.

In a read, modify, write operation, data packets associated with the object or other logical structure are located and read in a read operation. Data segments of the modified object or logical structure that have been modified are not written to the location from which they are read. Instead, the modified data segments are again converted to data packets and then written to the next available location in the virtual page currently being written. Object index entries for the respective data packets are modified to point to the packets that contain the modified data segments. The entry or entries in the object index for data packets associated with the same object or logical structure that have not been modified will include pointers to original location of the unmodified data packets. Thus, if the original object (or logical structure) is maintained, for example to maintain a previous version of the object, the original object will have pointers in the object index to all data packets as originally written. The new object will have pointers in the object index to some of the original data packets and pointers to the modified data packets in the virtual page that is currently being written.

In a copy operation, the object index includes an entry for the original object or other logical structure mapped to a number of packets stored in the solid-state storage media 110. When a copy is made, a new logical structure is created and a new entry is created in the object index mapping the new logical structure to the original packets. The new logical structure is also written to the solid-state storage media 110 with its location mapped to the new entry in the object index. The new logical structure packets may be used to identify the packets within the original logical structure that are referenced in case changes have been made in the original logical structure that have not been propagated to the copy and the object index is lost or corrupted. In another embodiment, the object index includes a logical entry for a logical block.

Beneficially, sequentially writing packets facilitates a more even use of the solid-state storage media 110 and allows the solid-state storage device controller 202 to monitor storage hot spots and level usage of the various virtual pages in the solid-state storage media 110. Sequentially writing packets also facilitates a powerful, efficient garbage collection system.

The system 100 may comprise called a log-structured storage system or log-structured array similar to a log-structured file system and the order that data is stored may be used to recreate an index. Typically an index that includes a logical-to-physical mapping is stored in volatile memory. If the index is corrupted or lost, the index may be reconstructed by traversing the solid-state storage media 110 in the order that the data was written. Within a logical erase block ("LEB"), data is typically stored sequentially by filling a first logical page, then a second logical page, etc. until the LEB is filled. The solid-state storage controller 104 then chooses another LEB and the process repeats. By maintaining an order that the LEBs were written to and by knowing that each LEB is written sequentially, the index can be rebuilt by traversing the solid-state storage media 110 in order from beginning to end. In other embodiments, if part of the index is stored in non-volatile memory, such as on the solid-state storage media 110, the solid-state storage controller 104 may only need to replay a portion of the solid-state storage media 110 to rebuild a portion of the index that was not stored in non-volatile memory. One of skill in the art will recognize other benefits of sequential storage of data packets.

Solid-State Storage Device Controller

In various embodiments, the solid-state storage device controller 202 also includes a data bus 204, a local bus 206, a buffer controller 208, buffers 0-N 222a-n, a master controller 224, a direct memory access ("DMA") controller 226, a memory controller 228, a dynamic memory array 230, a static random memory array 232, a management controller 234, a management bus 236, a bridge 238 to a system bus 240, and miscellaneous logic 242, which are described below. In other embodiments, the system bus 240 is coupled to one or more network interface cards ("NICs") 244, some of which may include remote DMA ("RDMA") controllers 246, one or more central processing unit ("CPU") 248, one or more external memory controllers 250 and associated external memory arrays 252, one or more storage controllers 254, peer controllers 256, and application specific processors 258, which are described below. The components 244-258 connected to the system bus 240 may be located in the computer 112 or may be other devices.

Typically the solid-state storage controller(s) 104 communicate data to the solid-state storage media 110 over a storage I/O bus 210. In a typical embodiment where the solid-state storage is arranged in banks 214 and each bank 214 includes multiple solid-state storage elements 216, 218, 220 accessed in parallel, the storage I/O bus 210 is an array of busses, one for each row of solid-state storage elements 216, 218, 220 spanning the banks 214. As used herein, the term "storage I/O bus" may refer to one storage I/O bus 210 or an array of data independent busses 204. In one embodiment, each storage I/O bus 210 accessing a row of solid-state storage elements (e.g. 216a, 218a, 220a) may include a logical-to-physical mapping for storage divisions (e.g. erase blocks) accessed in a row of solid-state storage elements 216a, 218a, 220a. This mapping allows a logical address mapped to a physical address of a storage division to be remapped to a different storage division if the first storage division fails, partially fails, is inaccessible, or has some other problem.

Data may also be communicated to the solid-state storage controller(s) 104 from a requesting device 155 through the system bus 240, bridge 238, local bus 206, buffer(s) 22, and finally over a data bus 204. The data bus 204 typically is connected to one or more buffers 222a-n controlled with a buffer controller 208. The buffer controller 208 typically controls transfer of data from the local bus 206 to the buffers 222 and through the data bus 204 to a pipeline input buffer and output buffer. The buffer controller 208 typically controls how data arriving from a requesting device can be temporarily stored in a buffer 222 and then transferred onto a data bus 204, or vice versa, to account for different clock domains, to prevent data collisions, etc. The buffer controller 208 typically works in conjunction with the master controller 224 to coordinate data flow. As data arrives, the data will arrive on the system bus 240, be transferred to the local bus 206 through a bridge 238.

Typically the data is transferred from the local bus 206 to one or more data buffers 222 as directed by the master controller 224 and the buffer controller 208. The data then flows out of the buffer(s) 222 to the data bus 204, through a solid-state storage controller 104, and on to the solid-state storage media 110 such as NAND flash or other storage media. In one embodiment, data and associated out-of-band metadata (such as object metadata) arriving with the data is communicated using one or more data channels comprising one or more solid-state storage controllers 104a-104n-1 and associated solid-state storage media 110a-110n-1 while at least one channel (solid-state storage controller 104n, solid-state storage media 110n) is dedicated to in-band metadata, such as index information and other metadata generated internally to the solid-state storage device 102.

The local bus 206 is typically a bidirectional bus or set of busses that allows for communication of data and commands between devices internal to the solid-state storage device controller 202 and between devices internal to the solid-state storage device 102 and devices 244-258 connected to the system bus 240. The bridge 238 facilitates communication between the local bus 206 and system bus 240. One of skill in the art will recognize other embodiments such as ring structures or switched star configurations and functions of buses 240, 206, 204, 210 and bridges 238.

The system bus 240 is typically a bus of a computer 112 or other device in which the solid-state storage device 102 is installed or connected. In one embodiment, the system bus 240 may be a PCI-e bus, a Serial Advanced Technology Attachment ("serial ATA") bus, parallel ATA, or the like. In another embodiment, the system bus 240 is an external bus such as small computer system interface ("SCSI"), FireWire, Fiber Channel, USB, PCIe-AS, or the like. The solid-state storage device 102 may be packaged to fit internally to a device or as an externally connected device.

The solid-state storage device controller 202 includes a master controller 224 that controls higher-level functions within the solid-state storage device 102. The master controller 224, in various embodiments, controls data flow by interpreting object requests and other requests, directs creation of indexes to map object identifiers or other logical identifiers associated with data to physical locations of associated data, coordinating DMA requests, etc. Many of the functions described herein are controlled wholly or in part by the master controller 224.

In one embodiment, the master controller 224 uses embedded controller(s). In another embodiment, the master controller 224 uses local memory such as a dynamic memory array 230 (dynamic random access memory "DRAM"), a static memory array 232 (static random access memory "SRAM"), etc. In one embodiment, the local memory is controlled using the master controller 224. In another embodiment, the master controller 224 accesses the local memory via a memory controller 228. In another embodiment, the master controller 224 runs a Linux server and may support various common server interfaces, such as the World Wide Web, hyper-text markup language ("HTML"), etc. In another embodiment, the master controller 224 uses a nano-processor. The master controller 224 may be constructed using programmable or standard logic, or any combination of controller types listed above. One skilled in the art will recognize many embodiments for the master controller 224.

In one embodiment, where the solid-state storage device controller 202 manages multiple solid-state storage media 110*a*-*n*, the master controller 224 divides the work load among internal controllers, such as the solid-state storage controllers 104*a*-*n*. For example, the master controller 224 may divide an object (or other logical structure) to be written to the data storage devices (e.g. solid-state storage media 110*a*-*n*) so that a portion of the object is stored on each of the attached data storage devices. This feature is a performance enhancement allowing quicker storage and access to an object. In one embodiment, the master controller 224 is implemented using an FPGA. In another embodiment, the firmware within the master controller 224 may be updated through the management bus 236, the system bus 240 over a network connected to a NIC 244 or other device connected to the system bus 240.

In one embodiment, the master controller 224, which manages objects or other logical structures, emulates block storage such that a computer 112 or other device connected to the solid-state storage device 102 views the solid-state storage device 102 as a block storage device and sends data to specific physical addresses in the solid-state storage device 102. The master controller 224 then divides up the blocks and stores the data blocks as it would objects or other logical structures. The master controller 224 then maps the blocks and physical address sent with the block to the actual locations determined by the master controller 224. The mapping is stored in the index. Typically, for block emulation, a block device application program interface ("API") is provided in a driver in the computer 112, client 114, or other device wishing to use the solid-state storage device 102 as a block storage device.

In another embodiment, the master controller 224 coordinates with NIC controllers 244 and embedded RDMA controllers 246 to deliver just-in-time RDMA transfers of data and command sets. NIC controller 244 may be hidden behind a non-transparent port to enable the use of custom drivers. Also, a driver on a client 114 may have access to the computer network 118 through an I/O memory driver using a standard stack API and operating in conjunction with NICs 244.

In one embodiment, the master controller 224 is also a redundant array of independent drive ("RAID") controller. Where the data storage device/solid-state storage device 102 is networked with one or more other data storage devices/solid-state storage devices 102, the master controller 224 may be a RAID controller for single tier RAID, multi-tier RAID, progressive RAID, etc. The master controller 224 also allows some objects, files, or other logical structures to be stored in a RAID array and other objects or logical structures to be stored without RAID. In another embodiment, the master controller 224 may be a distributed RAID controller element. In another embodiment, the master controller 224 may comprise many RAID, distributed RAID, and other functions as described elsewhere.

In one embodiment, the master controller 224 coordinates with single or redundant network managers (e.g. switches) to establish routing, to balance bandwidth utilization, failover, etc. In another embodiment, the master controller 224 coordinates with integrated application specific logic (via local bus 206) and associated driver software. In another embodiment, the master controller 224 coordinates with attached application specific processors 258 or logic (via the external system bus 240) and associated driver software. In another embodiment, the master controller 224 coordinates with remote application specific logic (via the computer network 118) and associated driver software. In another embodiment, the master controller 224 coordinates with the local bus 206 or external bus attached hard disk drive ("HDD") storage controller.

In one embodiment, the master controller 224 communicates with one or more storage controllers 254 where the storage device/solid-state storage device 102 may appear as a storage device connected through a SCSI bus, Internet SCSI ("iSCSI"), fiber channel, etc. Meanwhile the storage device/solid-state storage device 102 may autonomously manage objects, files, etc. and may appear as an object file system or distributed object file system. The master controller 224 may also be accessed by peer controllers 256 and/or application specific processors 258.

In another embodiment, the master controller 224 coordinates with an autonomous integrated management controller to periodically validate FPGA code and/or controller software, validate FPGA code while running (reset) and/or validate controller software during power on (reset), support external reset requests, support reset requests due to watchdog timeouts, and support voltage, current, power, temperature, and other environmental measurements and setting of threshold interrupts. In another embodiment, the master controller 224 manages garbage collection to free erase blocks for reuse. In another embodiment, the master controller 224 manages wear leveling. In another embodiment, the master controller 224 allows the data storage device/solid-state storage device 102 to be partitioned into multiple virtual devices and allows partition-based media encryption. In yet another embodiment, the master controller 224 supports a solid-state storage controller 104 with advanced, multi-bit ECC correction. One of skill in the art will recognize other features and functions of a master controller 224 in a solid-state storage controller 104, or more specifically in a solid-state storage device 102.

In one embodiment, the solid-state storage device controller 202 includes a memory controller 228 which controls a dynamic random memory array 230 and/or a static random memory array 232. As stated above, the memory controller 228 may be independent or integrated with the master controller 224. The memory controller 228 typically controls volatile memory of some type, such as DRAM (dynamic random memory array 230) and SRAM (static random memory array 232). In other examples, the memory controller 228 also controls other memory types such as electrically erasable programmable read only memory ("EEPROM"), etc. In other embodiments, the memory controller 228 controls two or more memory types and the memory controller 228 may include more than one controller. Typically, the memory controller 228 controls as much SRAM 232 as is feasible and by DRAM 230 to supplement the SRAM 232.

In one embodiment, the index is stored in memory 230, 232 and then periodically off-loaded to a channel of the solid-state storage media 110*n* or other non-volatile memory. One of skill in the art will recognize other uses and configurations of the memory controller 228, dynamic memory array 230, and static memory array 232.

In one embodiment, the solid-state storage device controller 202 includes a DMA controller 226 that controls DMA operations between the storage device/solid-state storage device 102 and one or more external memory controllers 250 and associated external memory arrays 252 and CPUs 248. Note that the external memory controllers 250 and external memory arrays 252 are called external because they are external to the storage device/solid-state storage device 102. In addition the DMA controller 226 may also control RDMA operations with requesting devices through a NIC 244 and associated RDMA controller 246. DMA and RDMA are explained in more detail below.

In one embodiment, the solid-state storage device controller 202 includes a management controller 234 connected to a management bus 236. Typically the management controller 234 manages environmental metrics and status of the storage device/solid-state storage device 102. The management controller 234 may monitor device temperature, fan speed, power supply settings, etc. over the management bus 236. The management controller 234 may support the reading and programming of erasable programmable read only memory ("EEPROM") for storage of FPGA code and controller software. Typically the management bus 236 is connected to the various components within the storage device/solid-state storage device 102. The management controller 234 may communicate alerts, interrupts, etc. over the local bus 206 or may include a separate connection to a system bus 240 or other bus. In one embodiment the management bus 236 is an Inter-Integrated Circuit ("I²C") bus. One of skill in the art will recognize other related functions and uses of a management controller 234 connected to components of the storage device/solid-state storage device 102 by a management bus 236.

In one embodiment, the solid-state storage device controller 202 includes miscellaneous logic 242 that may be customized for a specific application. Typically where the solid-state storage device controller 202 or master controller 224 is/are configured using a FPGA or other configurable controller, custom logic may be included based on a particular application, customer requirement, storage requirement, etc.

Failure Prediction Apparatus

Figure 3A:
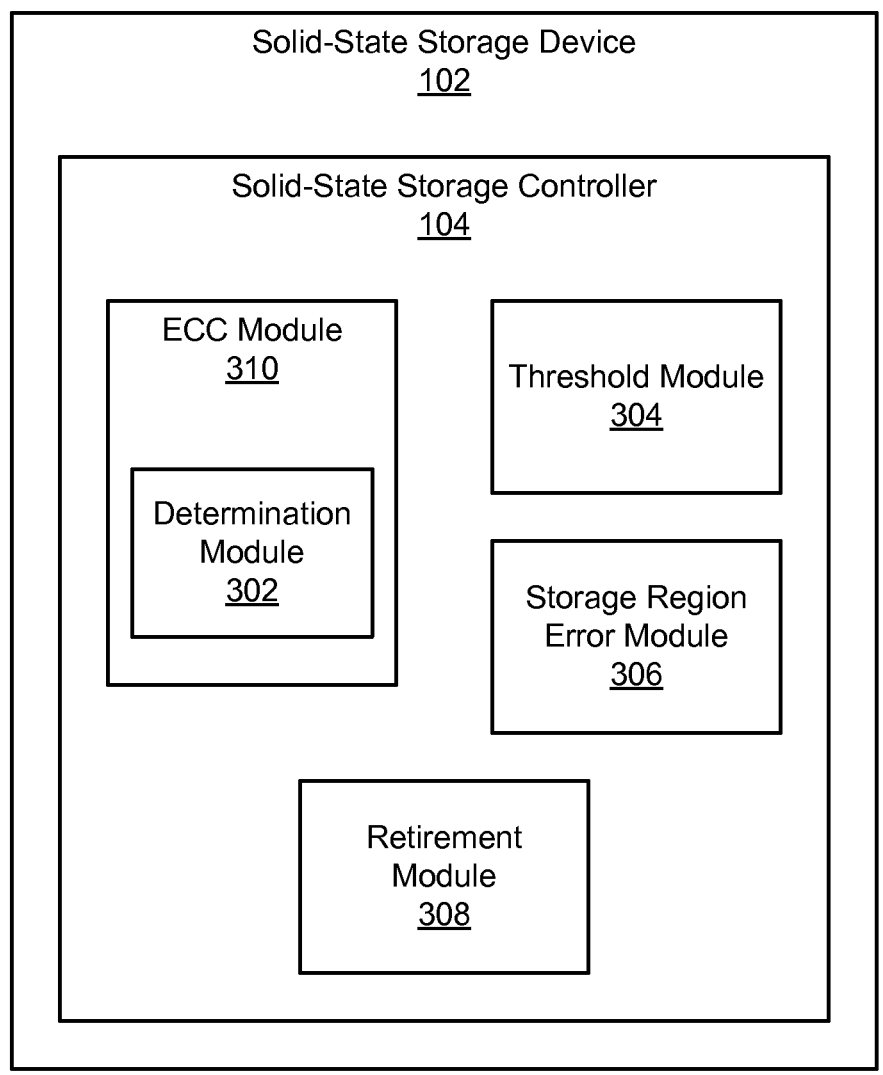
FIG. 3A is a schematic block diagram illustrating one embodiment of an apparatus for predicting failures in solid-state storage in accordance with the present invention.

FIG. 3A is a schematic block diagram illustrating one embodiment of an apparatus 300 for predicting failures in solid-state storage in accordance with the present invention. The apparatus 300 includes a solid-state storage device 102 with a solid-state storage controller 104 with a determination module 302, a threshold module 304, a storage region error module 306, retirement module 308, and an ECC module 310 which are described below.

The solid-state storage device 102 and solid-state storage controller 104 are substantially similar to those described above. While the modules 302-308 are depicted in the solid-state storage controller 104, all or a portion of each module 302-308 may be located other than in the solid-state storage controller 104, such as in a server, client 114, computer 112, driver, etc.

In one embodiment, the apparatus 300 include a determination module 302 that determines that data that is stored in an ECC chunk contains errors that are correctable using an Error Correcting Code ("ECC") stored with the data and an ECC algorithm. The ECC algorithm may be used by an ECC module 310 to generate ECC from data of an ECC chunk and then to use data of the ECC chunk along with the ECC stored also in the ECC chunk to detect and correct bits in error in the ECC chunk. In one embodiment the ECC is a block code. In another embodiment, the ECC is not a block code, but is capable of error detection and correction for a set of data. In one embodiment, the ECC may comprise a convolutional code. One of skill in the art will recognize other forms of ECC capable of detecting data errors and correcting errors and applicable to the present invention.

The ECC chunk is located on non-volatile, solid-state storage media 110 and may be part of a solid-state storage device 102 as described in relation to the system 100 in FIG. 1. The solid-state storage media 110 may be NAND flash storage. In other embodiments, the ECC chunk is located on non-volatile, solid-state storage media in cache, a storage card, or other type of storage. Typically an ECC chunk is a unit of storage that is read and the ECC module 310 corrects bits in error in the data using an ECC algorithm along with ECC data generated by a corresponding ECC algorithm that generates the ECC data from user data stored within the ECC chunk. In one embodiment, the ECC chunk is a portion of storage media on a chip within the solid-state storage media 110. In another embodiment, an ECC chunk includes portions of data from an array of solid-state storage media 110a-n. In another embodiment, data is read from a logical page and includes multiple ECC chunks.

Figure 3B:
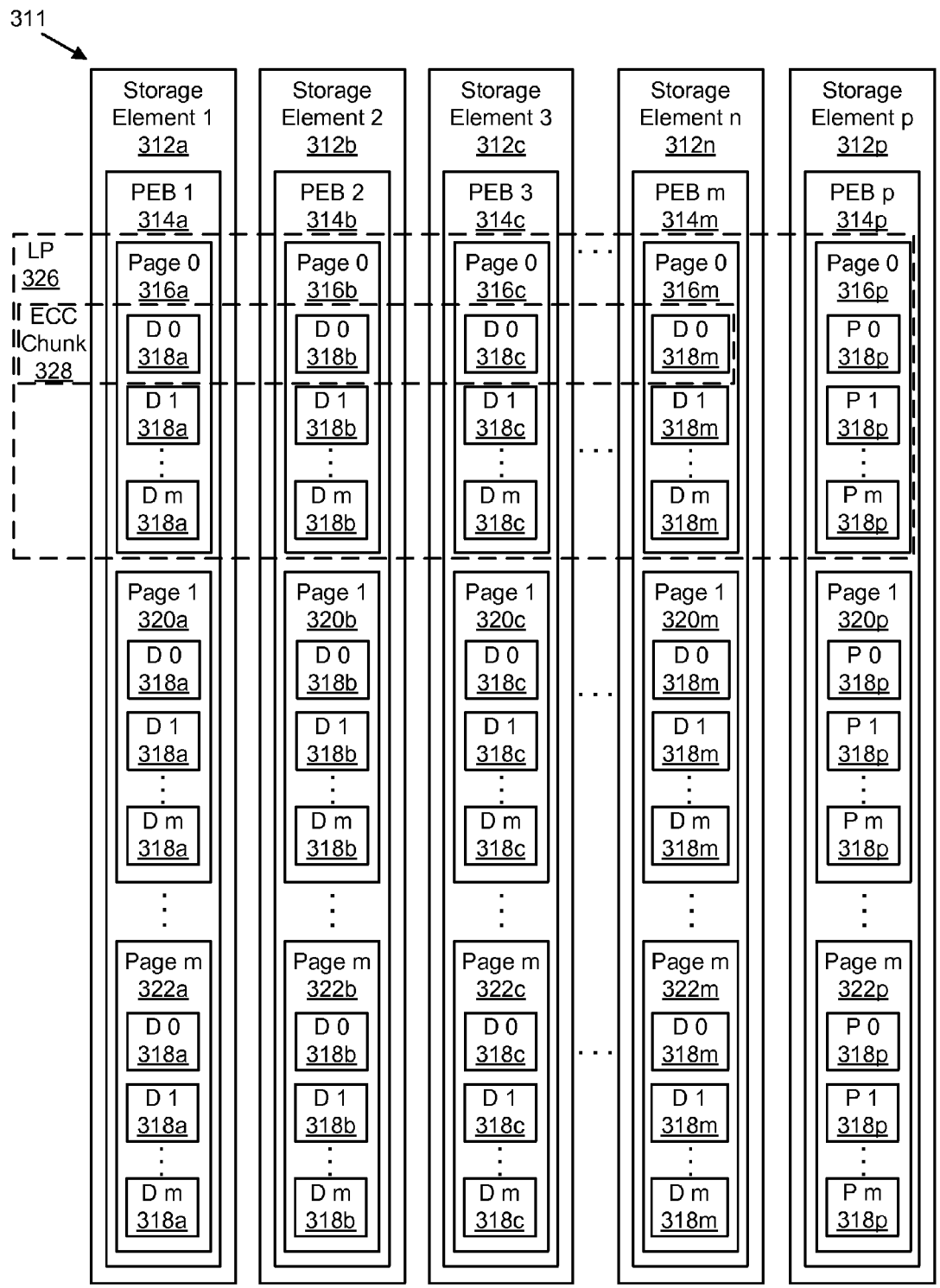
FIG. 3B is a schematic block diagram illustrating one embodiment of an ECC Chunk in accordance with the present invention.
Figure 3C:
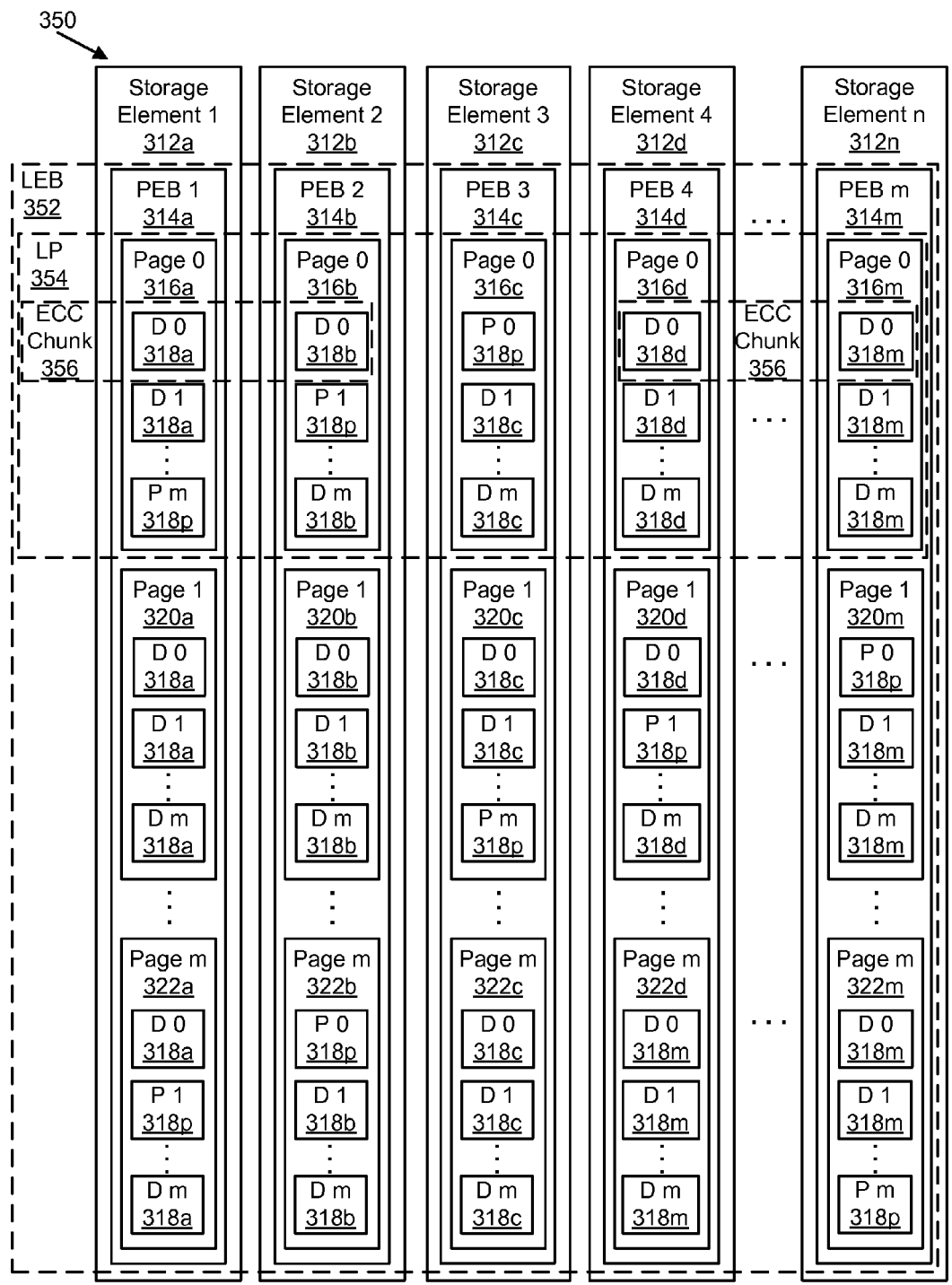
FIG. 3C is a schematic block diagram illustrating another embodiment of an ECC Chunk in accordance with the present invention.

In a particular embodiment, an ECC chunk spans solid-state storage elements (e.g. 216a-m) and includes at least a portion of each physical page in a logical page. ECC data protection technologies allow an ECC chunk to include a relatively large amount of data so that an ECC chunk may include multiple rows of data of each physical page of a logical page. The ECC chunk, in one embodiment, includes data protected by ECC data along with the ECC data. The ECC data may be stored, in one embodiment, after user data in the ECC chunk. FIGS. 3B and 3C describe particular embodiments of an ECC chunk.

FIG. 3B is a schematic block diagram illustrating one embodiment of an array 311 of N+P number of storage elements 312 in accordance with the present invention. The array 311 of storage elements 312, in one embodiment, includes N number of storage elements 312a, 312b, . . . 312n and P number of storage elements 312p storing parity data generated from the data stored on the N number of storage elements 312a . . . 312n. The storage element 312 storing parity data 312p may be a dedicated parity storage element 312 that may only store parity data. In addition, the parity data may be rotated among the storage elements 312 as described below. While a single parity storage element 312p is depicted, one of ordinary skill in the art realizes that a plurality of parity storage elements 312p may be used. Each storage element 312 may comprise a device, a chip, a portion of a chip, a die, and the like.

Furthermore, in one embodiment each storage element 312 includes a physical erase block ("PEB") 314. For example, storage element one 312a includes PEB one 314a. A physical erase block is typically an erase block located on one die, chip, or other storage element 312. Each PEB 314 includes m physical pages 316. For example, PEB one 314a includes page 0 316a, page 1 320a, . . . page m 322a. Each physical page 316a stores a portion of data and Error Correcting Code ("ECC") distributed with the data ("D") 318. Moreover, the physical pages 316p, 320p, . . . 322p on the parity storage element 312p store parity data 318p.

In one embodiment, a group of PEBs forms a logical erase block ("LEB"). An LEB 324 spans the array of N+P storage elements 311 including the parity storage element 312p. Furthermore, in an embodiment, a logical page ("LP") 326 spans a plurality of physical pages 320 in a row, including the physical pages 320p on the parity storage element 312p. In another embodiment a logical page 326 spans N storage elements 312a-n without the parity storage element 312p such that parity data is stored on the storage element 312p with parity data in a separate step than data is stored in the N storage elements 312a-n.

In one embodiment, the ECC is a block code that is distributed with the data. Furthermore, the data and the ECC may not be aligned to any particular physical hardware boundary. As a result, error correction with the ECC is not dependent on a particular hardware configuration. Therefore, the ECC and corresponding data may form an ECC chunk and the ECC chunk may be divided and stored on one or more of the N storage elements 312*a-n*. An ECC chunk 328 typically spans at least a portion of a plurality of physical pages 316 of a logical page 326 where the data and ECC generated from the data 318*a*, 318*b*, . . . 318*m* are spread across the N storage elements 312*a-n* not including the parity data 318*p* on the parity storage element 312*p*. The storage element containing parity data 312*p* may be dynamically rotated among the storage elements comprising the array 311 of storage elements 312. In one embodiment, a LP 326 includes a plurality of ECC chunks 328. A physical page 316 may contain one or more data bytes of the ECC chunk 328. An ECC chunk 328 may span multiple rows within a physical page 316 and a physical page 316 may include a plurality of ECC chunks 328.

FIG. 3C is a schematic block diagram illustrating another embodiment of an array of N+P storage elements 350 with distributed parity in accordance with the present invention. In the depicted embodiment, the parity data 318*p* is distributed. Therefore, the storage elements 312 of the logical page 354 that store parity data 318*p* alternate. For example, LP 354 includes parity data 318*p* on storage element 3 312*c* for a particular row of data parity data 318*p* on storage element 2 312*b* for another row of data. In this embodiment, the ECC chunk 356 is still independent of parity data. In another embodiment, the parity information is stored within the same storage element 312 for all ECC chunks 356 within a LP 354 and changes only on LP 354 boundaries. In another embodiment, the location of the parity is stored within the same storage element 312 within an LEB 352 and changes only on LEB 352 boundaries. One of skill in the art will recognize other forms of an ECC chunk that may be read and ECC algorithms used to detect and correct errors.

Referring now to FIG. 3A, the determination module 302 also determines a bit error count for the ECC chunk. A bit error count, as used herein, comprises a number of bit errors in data of an ECC chunk. The bit error count is derived using the ECC stored in the ECC chunk. The determination module 302, in one embodiment, determines that the errors in the ECC chunk are correctable by determining that the bit error count for the ECC chunk is lower than a maximum number of bit errors correctable using an ECC correction algorithm corresponding to the ECC algorithm used to generate the particular ECC stored in the ECC chunk. For example, an ECC correction algorithm may be able to correct 11 bit errors within data of the ECC chunk.

Typically the determination module 302 works in conjunction with a read operation and the ECC module 310 that uses ECC to both detect and correct errors in the data that is read. If the determination module 302 determines that the data includes a large enough count of bit errors that the errors are not correctable, the error may be flagged and corrective action may be taken. An example of possible corrective action is described below in the description of the apparatus 400 shown in FIG. 4.

In another embodiment, the apparatus 300 includes a threshold module 304. If the determination module 302 determines that the number of bit errors in the data stored in the ECC chunk is correctable, a threshold module 304 determines if the number of errors in the data stored in the ECC chunk satisfies an ECC chunk error threshold.

The ECC chunk error threshold includes a bit error count that satisfies an acceptable error threshold as a minimum and is below a maximum number of ECC correctable errors for the ECC chunk. The acceptable error threshold, in one embodiment, is a maximum number of bit errors that can be tolerated while maintaining a high degree of reliability in the data. The acceptable error threshold may be a number of errors that may be assumed to be naturally occurring because of soft errors based on the size of the ECC chunk used to determine the bit error count. For example, testing may reveal that, for an ECC chunk that can correct errors in 11 bits, an acceptable error threshold may be 3 bits in error. In this example, the number ECC correctable errors is 11 and the acceptable error threshold is 3 so the ECC chunk error threshold may be any bit count error from 4 to 10.

The acceptable error threshold may be chosen to allow some soft errors so that the ECC chunk error threshold cannot be met until the bit error count satisfies the acceptable error threshold and the maximum number of ECC correctable errors. The ECC chunk error threshold is below the maximum number of ECC correctable errors; a bit error count greater than the maximum number of ECC correctable errors may trigger a reset, a non-recoverable data error, or other action associated with a bit count higher than what would be correctable using the ECC data stored with the ECC chunk.

For example, the ECC and ECC algorithm may be used by the ECC module 310 to correct up to eight bits in error but the ECC chunk error threshold may be set to four bits in error. The data in the ECC chunk may contain 6 bits in error. The determination module 302 may determine that the errors in the ECC chunk are correctable and then the threshold module 304 may then determine that the ECC chunk error threshold, set to four errors, has been satisfied by the six errors. In one embodiment, the threshold module 304 may determine that the bit error count for the ECC chunk satisfies the ECC chunk error threshold when the bit error count matches or exceeds the ECC chunk error threshold.

In one embodiment, the threshold module 304 may include multiple thresholds and may make multiple determinations of whether or not errors in the ECC chunk satisfy the multiple thresholds. For example, the threshold module 304 may have an overall ECC chunk error threshold and a lower error threshold for each portion of the ECC chunk in a chip, die, PEB, physical page, etc. The threshold module 304 may evaluate each threshold separately or may require that the overall ECC chunk error threshold be satisfied before evaluating bits in error within a smaller portion of the ECC chunk.

In one example, if the ECC chunk error threshold is five and the bit error count is five or greater, the threshold module 304 may then evaluate the location of each bit in error and may determine if the bit error count for a chip, die, etc. satisfies the bit error threshold for that portion of the ECC chunk. In another embodiment, the threshold module 304 determines that the bit error count satisfies the bit error count when the bit error count satisfies the ECC chunk error threshold and independently determines whether a bit error count for each portion of the ECC chunk satisfies an error threshold for that portion.

Beneficially the threshold module 304 allows some bit errors. Typically, a tolerance for a few bit errors are expected due to soft errors. Soft errors are errors that are not indicative of a hardware failure. For example, soft errors may be bit flips caused by random alpha particles, voltage transients, read or program disturbs, etc. A bit flip caused by soft error are by definition correctable and when a storage region, such as an LEB 324, 352 is garbage collected, the storage region is erased and the cell voltages renewed. By tracking bit error counts over an ECC chunk error threshold, naturally occurring soft errors may be ignored and more serious hard errors, which may cause higher bit error counts, may be tracked.

Additionally, where a relatively inexpensive media is used, more bits in error may be expected. Using a relatively large ECC chunk and a robust ECC algorithm capable of a relatively high number of ECC correctable errors can compensate for the increased errors. However, using standard error determination techniques would typically trigger a higher number of errors and may lead to retirement of a storage media even though a large portion of the media is still usable. Having an ECC chunk error threshold that allows a few bits in error in connection with a relatively large ECC chunk and a relatively high number of ECC correctable errors may prolong the useful life of the storage media and reliability of the storage media.

In one embodiment, the threshold module 304 further determines if a bit error count for a portion of an ECC chunk, such as a bit error count for a storage element (e.g. 216a) satisfies a storage element error threshold. This further determination may be used to determine if a particular storage element in the ECC chunk (e.g. 216a) has a high number of bit errors. If bit errors are concentrated in a solid-state storage element 216, 218, 220, the solid-state storage element 216, 218, 220 may have hard errors, may be failing, etc. One of skill in the art will recognize other ways that the threshold module 304 may determine if errors in the ECC chunk satisfy one or more ECC chunk error thresholds.

In one embodiment, the apparatus 300 includes a storage region error module 306 that determines that a storage region that contains at least a portion of the ECC chunk satisfies a region retirement criteria. A storage region may include one or more of an ECC chunk, a plurality of ECC chunks, a page, a logical page spanning a plurality of solid-state storage chips, a PEB 314, a LEB 324, 352, a logical erase block 352 spanning a plurality of solid-state storage chips, a chip, a row of die within a memory array, a row of chips, a column of chips, a column of die within a memory array, a die on a chip, and the like. In one embodiment, if the threshold module 304 determines that the bit error count of the ECC chunk satisfies the ECC chunk error threshold, the storage region error module 306 determines if the number of data errors within a storage region satisfies a region retirement criteria. A storage region includes at least a portion of the ECC chunk where the portion includes errors.

A storage region may be any portion of the solid-state storage media 110 that may be retired. For example, a storage region may be one or more of an ECC chunk, multiple ECC chunks, a page, a logical page spanning multiple solid-state storage chips, a PEB 314, a LEB 324, 352, a chip, a row of chips, a column of chips, and a die on a chip. In one embodiment, a storage region may be any physical part of the solid-state storage media 110 that may be isolated for a single read, program, or erase operation or for a read-modify-write operation. One of skill in the art will recognize other storage region types. It should be noted that the storage region that is retired will include at least one physical hardware storage element such that retirement of the storage region protects storage data from being stored on the storage element and then later experiencing an uncorrectable number of bit errors. The hardware storage element may comprise a single storage cell, storage die, storage chip or a combination of one or more of these elements.

In one embodiment, a storage region may include the ECC chunk along with other adjacent storage regions determined by analysis to either contain errors or exhibit a high probability of also containing errors. Analysis of adjacent storage is discussed more detail below with respect to the apparatus 400 described in relation to FIG. 4. Other ways of analyzing data errors to determine if the errors satisfy a region retirement criteria are also described in relation to FIG. 4.

In one embodiment, the apparatus 300 includes a retirement module 308. If the storage region error module 306 determines that that errors within the storage region satisfy the region retirement criteria, the retirement module 308 places the storage region that includes at least the ECC chunk in a retired state. In one embodiment, the retired state is a state where the storage region is no longer used to store data, is inactive, is partitioned off, etc. In another embodiment, a storage region may be retired temporarily or may be retested to determine if errors are persistent. A retired state may also include a state where data in the storage region is stored temporarily until it can be removed at a convenient time. For example, the data may be marked for garbage collection. A storage region in a retired state may also be placed in a verification state where the storage region is tested to determine if data errors are persistent or if the storage region may be returned to service.

A storage region in a retired state may have portions of the storage region that are functional that may then be reused or recombined with other portions to make up a different logical storage structure. In certain embodiments, the logical storage structure may also relate directly to one or more storage regions. Typically the storage region error module 306 analyzes errors in the ECC chunk, and possibly in other adjacent storage, to determine if the number or type of errors warrant retiring the storage region. By placing the storage region in a retired state, the solid-state storage device 102 typically has a higher degree of data reliability than a device without the apparatus 300 described in relation to FIG. 3A.

A storage region may be retired by the retirement module 308 by marking the storage region as unavailable in some way. For example, a logical-to-physical map or index may be marked so that the storage region is ineligible to have data stored in the storage region. In another example, a bit map or table may be updated to show the storage region as unavailable. The storage region may be retired by placing it in a special retire state, by removing the address of the storage region from a map, etc. One of skill in the art will recognize other ways to retire a storage region.

Figure 4:
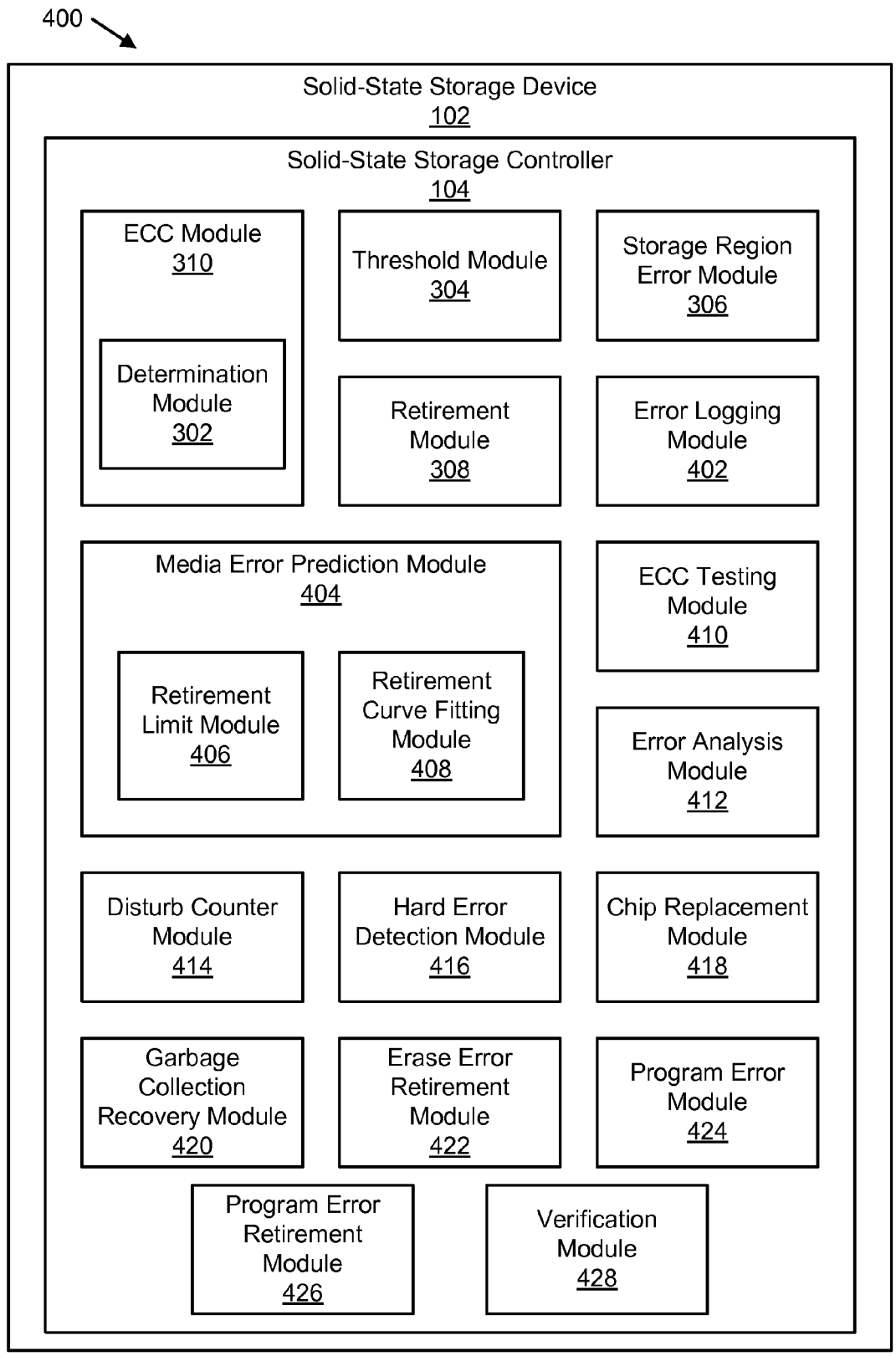
FIG. 4 is a schematic block diagram illustrating an alternate embodiment of an apparatus for predicting failures in solid-state storage in accordance with the present invention.

FIG. 4 is a schematic block diagram illustrating an alternate embodiment of an apparatus 400 for predicting failures in solid-state storage in accordance with the present invention. The apparatus 400 includes a solid-state storage device 102 with a solid-state storage controller 104 with a determination module 302, a threshold module 304, a storage region error module 306, retirement module 308, and ECC module 310, which are substantially similar to those described above in relation to FIGS. 2 and 3.

The apparatus 400 also includes an error logging module 402, a media error prediction module 404 with a retirement limit module 406 and a retirement curve fitting module 408, an ECC testing module 410, an error analysis module 412, a disturb counter module 414, a hard error detection module 416, a chip replacement module 418, a garbage collection recovery module 420, an erase error retirement module 422, a program error module 424, a program error retirement module 426, and a verification module 428, which are described below. As with the modules 302-308 in the apparatus 300 in FIG. 3A, all or a portion the modules 302-308, 402-428 in the apparatus 400 may be located external to the solid-state storage controller 104 and the solid-state storage device 102.

The apparatus 400 includes an error logging module 402. In one embodiment, the error logging module 402 records an identifier for at least a portion of the storage region of the ECC chunk and a time indicator associated with determining the bit error count. The ECC chunk with the identifier recorded by the error logging module 402 is the ECC chunk with the bit error count that satisfies the ECC chunk error threshold, as determined by the threshold module 304. The identifier identifies one or more physical storage elements of one or more storage regions associated with the ECC chunk, associated with an LEB 324, 352, associated with a PEB 314, associated with a physical page, associated with a logical page, associated with a chip, associated with a solid-state storage element 216, 218, 220, or any other portion of a physical storage region used to store the ECC chunk. In other embodiments, the error logging module 402 may record multiple identifiers. By recording a time indicator when a bit error count of an ECC chunk satisfies the ECC chunk error threshold, the apparatus 400 may use the time indicator to determine a rate of instances of bit error counts that satisfy the ECC chunk error threshold. The identifier for the storage region, or other portion of the storage region, that contains the ECC chunk may be used to track bit error counts that satisfy the ECC chunk error threshold for each storage region or portion of a storage region. In another embodiment, the error logging module 402 records an identifier for a portion of a storage region, such as a PEB 314, a page, a storage element 312, etc. and may also store an identifier for the storage region. The recorded identifier may be bit in a bit map, a physical address, or any other suitable way to identify a storage region or portion of a storage region.

In another embodiment, the error logging module 402 records a time indicator associated with when the storage region error module 306 determined that errors in the storage region satisfy the region retirement criteria. In another embodiment, the error logging module 402 also records a location of the storage region with the ECC chunk with errors. The error logging module 402 may store one or more locations associated with the storage region. For example, the error logging module 402 may store multiple identifiers for one or more of ECC chunks, pages, PEBs 314, LEBs 324, 352, chips, etc. with errors or retired as part of the storage region being retired.

The error logging module 402 may store time indicator and location information in metadata, in a log, in an index, or any other suitable storage location or structure. In one embodiment, the error logging module 402 stores time indicator and location information as part of an index such that future read or program requests to the locations associated with the retired storage region are flagged as retired. Also, the index may be searched to compile and/or use the information stored by the error logging module 402. In another embodiment, other information is stored by the error logging module 402, such as type of errors, error locations, etc.

In one embodiment, the error logging module 402 may record PEBs 314 and/or LEBs 324, 352 that are retired. In this embodiment, tracking LEBs 324, 352 may be a more accurate predictor of available storage capacity than solely monitoring retired PEBs 314. In certain embodiments, exclusively, tracking retired PEBs 314 when LEBs 324, 352 are retired may not be accurate since some PEBs 314 in a retired LEB 324, 352 may be functional and may be reused by the solid-state storage controller 104. For example, the error logging module 402 may record PEBs 314 retired as well as associated LEBs 324, 352. If a first PEB 314 is retired, the associated first LEB 324, 352 may be retired. PEBs 314 within the retired first LEB 324, 352 other than the retired first PEB 314 may be functional and then be available to the solid-state storage controller 104 as spares. When a second PEB 314 in a second LEB 324, 352 is retired, the solid-state storage controller 104 may substitute a spare PEB 314 from the retired first LEB 324, 352 into the second LEB 324, 352 if the second PEB 314 is not in the same chip (i.e. same column) as the first PEB 314, thus keeping the second LEB 324, 352 available for storage.

However, if the second PEB 314 is from the same chip (i.e. in the same column) as the first PEB 314, the second LEB 324, 352 may then have to be retired. Thus tracking retired LEBs 324, 352 may be an indicator of lost storage capacity and a rate of retired LEBs 324, 352 may be used to predict when the solid-state storage device 102 may fail or should be retired. One of skill in the art will recognize other information suitable for storage by the error logging module 402.

The time indicator may be any indicator that indicates a temporal context for errors found in the ECC chunk, when the threshold module 304 determined that the errors satisfied an ECC chunk error threshold, when the storage region error module 306 determined that the data errors in the ECC chunk satisfied the ECC chunk error threshold, when the storage region was retired, etc. The time indicator may be a timestamp, a time of solid-state storage device operation, a counter, an indicator of number of completed commands, an indicator of number of executed operations, or any other indicator suitable for determining a rate of errors or rate of when a storage region is retired. The number of executed operations may be broken down by type of operation. One of skill in the art will recognize other forms of a time indicator.

In another embodiment, the apparatus 400 includes a media error prediction module 404 that monitors a storage region retirement rate and a retirement limit module 406 that determines that the storage region retirement rate satisfies a storage region retirement threshold and, in one embodiment, sends a notification that the storage region retirement rate satisfies the storage region retirement threshold. The retirement limit module 406, in one embodiment, may notify a system operator of an impending failure. In another embodiment, the retirement limit module 406 may notify the solid-state storage controller 104 so that the controller 104 may stop storing data in the storage region, may replace data in the storage region with data in a spare solid-state storage element 216, 218, 220, may trigger modifying a RAID array structure, etc. In one embodiment, the storage region retirement rate may be determined from the time indicators recorded by the error logging module 402. The media error prediction module 404 may use any suitable criteria to determine that a rate of retiring storage regions has reached a storage region retirement threshold. Beneficially, the retirement limit module 406 allows prediction of a failure so that a system administrator or the solid-state storage controller 104 can take steps to prevent data loss prior to a failure.

For example, solid-state storage device qualification testing may be used to build a history of errors for a particular non-volatile solid-state storage media so that a storage region retirement threshold may be chosen to be a storage retirement rate that is below a known rate that typically occurs just before failure of the solid-state storage media 110. The storage region retirement threshold may be set based on probability, test results, experience, etc.

In another embodiment, the media error prediction module 404 may include a retirement curve fitting module 408 that uses a curve fitting algorithm and the time indicators recorded by the error logging module 402 to predict a time when the rate of storage regions being placed in a retired state has satisfied a storage region retirement threshold. The retirement curve fitting module 408 may use polynomial curve fitting, may fit curves to data points, may use geometric curve fitting, etc. The retirement curve fitting module 408 may then use the generated curve to predict failure, predict a time or storage region retirement rate before failure to retire all or a portion of the solid-state storage device 102. The retirement curve fitting module 408 may also use the generated curve to set the storage region retirement threshold. In another embodiment, the generated curve may be used to generate a storage region retirement rate limit that changes over time.

In another embodiment, the media error prediction module 404 uses a combination of rules and heuristics to determine when the storage region retirement rate has reached an unacceptable level. For example, temperature of a chip and or ambient temperature around the non-volatile solid-state storage media in combination with a high bit error count or multiple instances of a high bit error count may be used to signal retirement of a storage region when a similar number of errors or instances of errors when the chip temperature is low may not trigger retirement. Other environmental factors, such as supply voltage levels, operation type, criticality of the data, etc. may also be used to form or modify a region retirement criteria.

In one embodiment, a solid-state storage chip failure probability may be used in conjunction with the data from the error logging module 402 to determine an expected life. In another embodiment, a required length of service and the data from the error logging module 402 may be used generate a probability that the solid-state storage device 102 may reach the required length of service. A date of the next service or planned outage and the data from the error logging module 402 may be used to determine a probability of the solid-state storage device 102 will be operable until the next service or planned outage. One of skill in the art will recognize other ways that rules, heuristics, curve fitting, etc. can be used to predict an unacceptable rate of storage region retirement.

Rather than a rate, the region retirement criteria may be a simple threshold. For example, the region retirement criteria may be a threshold of a number of instances when the threshold module 304 determines that the bit error count of an ECC chunk within a particular storage region satisfied the ECC chunk error threshold. The region retirement criteria may also be more complex and may correlate instances of errors reported by the threshold module 304 with portions of the ECC chunks where the instances occurred, such as within a particular physical page or PEB 314. The region retirement criteria may have cumulative thresholds, thresholds for ECC chunks or other portion of a storage region, etc. For example, the storage region error module 306 may determine that data errors within a storage region satisfy a region retirement criteria by determining that the bit error count of an ECC chunk includes a high number of errors in a storage element 312, chip, die, etc., for example above a bit error count threshold for a page or PEB 314.

In another example, the storage region may be defined to include the ECC chunk combined with storage adjacent to the ECC chunk. The storage region error module 306 may then determine if data errors within a storage region satisfy a region retirement criteria by determining that errors within a storage region adjacent to the storage region containing the ECC chunk and errors within the ECC chunk satisfy the region retirement criteria. The apparatus 400 may analyze errors of the ECC chunk and adjacent storage in any number of ways.

For example, the apparatus 400 may include an ECC testing module 410 that runs an ECC analysis on one or more ECC chunks adjacent to the ECC chunk to determine that the adjacent storage region has errors. For example, the ECC testing module 410 may read data from an ECC chunk with a physical page adjacent to a physical page determined by the determination module 302 and the threshold module 304 to have a bit error count that satisfies a bit error threshold. An ECC analysis may be a set of stress tests, repeated read operations, program operations, erase operations, or combinations of operations to gauge the reliability of the storage region. An ECC analysis may be an industry standard test. In one embodiment, the ECC testing module 410 runs the analysis after the threshold module 304 determines that the number of errors in the ECC chunk satisfies the ECC chunk error threshold. In another embodiment the ECC testing module 410 runs an ECC analysis on adjacent storage that is not the same size as the ECC chunk with a bit error count that satisfies the ECC chunk error threshold. The ECC chunk and other adjacent ECC chunks with data errors may then comprise a storage region and the storage region error module 306 may then determine if the storage region satisfies the region retirement criteria.

In another embodiment, the apparatus 400 includes an error analysis module 412 that determines if the adjacent storage has errors by examining the locations of retired storage regions recorded by the error logging module 402 to determine if retired storage regions are adjacent to the ECC chunk. The storage region error module 306 may then determine if the ECC chunk and adjacent storage locations recorded by the error logging module 402 satisfy the region retirement criteria.

In another embodiment, region retirement criteria may also include a threshold number of errors within a column of storage media organized as a two-dimensional array. The storage region error module 306 may then determine if a number of errors within a column of storage satisfy a column threshold. The retirement module 308 may then retire an appropriate storage region that includes the column with errors. For example, the column of data with errors may be indicative of a hardware failure and the storage region error module 306 may identify storage region that will isolate the hardware failure. For example, the storage region may be a chip or die.

In another embodiment, the region retirement criteria may also include a threshold number of errors within a row of storage and the storage region error module 306 may determine if a number of errors within a row of storage satisfies a row threshold. In another embodiment, the region retirement criteria may include a threshold number of errors clustered together within an area of storage and the storage region error module 306 may determine of a number of errors within the area of storage satisfies an area threshold. The storage region error module 306 may then identify a storage area for retirement that includes the cluster of errors. One of skill in the art will recognize other criteria that may be part of the region retirement criteria and that may be used to determine if errors in a storage region satisfy the region retirement criteria.

In typical solid-state storage media 110, soft errors may occur and may be acceptable. A soft error is hereby designated as an a bit error that is transient in nature such that the storage location with the bit error can be erased and reused without encountering the same bit error. For example, read disturb is a term describing bit errors caused in an area adjacent to a location being read. For example, data lines used to read a location and running past adjacent storage locations may cause a bit flip when the data lines are activated to read data.

Storage may also be affected by writing data which may also cause bit errors in adjacent storage. Other soft errors may also be caused by transient voltages, alpha particles, etc. Soft errors may be tolerable if data affected has a number of errors that are correctable using ECC. If errors are correctable and can be classified as soft errors, the storage region error module 306 may determine that the errors do not satisfy the region retirement criteria, even if the number of errors satisfies a threshold.

In one embodiment, the apparatus 400 includes a disturb counter module 414 that tracks a storage location of each read and/or write/program operation and a number of reads and/or writes/programs at each of the storage regions. In one example, the disturb counter module 414 includes tracking read and write/program operations separately. In another example, the disturb counter module 414 tracks read and write/program operations together in a single value. In one embodiment, part of the region retirement criteria includes a disturb criteria where a factor for the storage region error module 306 determining that data errors within a storage region do not satisfy the region retirement criteria is determining that the number of reads and programs in the storage region and/or at least one storage location adjacent to the storage region that contains the ECC chunk has satisfied the disturb criteria.

For example, for a storage region that would otherwise satisfy a region retirement criteria the retirement module 308 may allow the storage region to remain in service in a non-retired state if the disturb counter module 414 determines that a disturb count of read and/or program operations satisfies a disturb threshold. In another embodiment, the storage region error module 306 determines that a storage region fails to meet the region retirement criteria when the disturb counter module 414 determines that a read count and/or a write count satisfies a disturb threshold. In a further embodiment, the storage region is marked for garbage collection, which is discussed in more detail with regard to the garbage collection recovery module 420.

Hard errors are defined herein as errors that are due to hardware failure such that the location in error either cannot be corrected and reused or has an error rate that is unacceptable. Typically hardware errors require retirement of a storage region regardless of other indicators pointing to soft errors. In one embodiment, the region retirement criteria includes a hard error criteria and the apparatus 400 includes a hard error detection module 416 that analyzes locations of errors within the storage region to determine if the error locations indicate a hardware failure that satisfies the hard error criteria. For example the hard error detection module 416 may determine that a row, column, or storage sub-region includes an unacceptable number of errors and the pattern of errors may indicate a hardware failure in the solid-state storage media 110.

In another embodiment, the apparatus 400 may include a chip replacement module 418 that replaces a chip in the event that a storage region is a chip and the retirement module 308 retires a chip. The chip may be replaced by deactivating the chip being retired and activating another replacement chip. In another embodiment, a chip, portion of chip, solid-state storage element 216, 218, 220, etc. is logically deactivated where data from a corresponding portion of a spare chip or solid-state storage element 216, 218, 220 is substituted by remapping. Typically the replacement chip contains or is loaded with data that matches data on the replaced chip. In one embodiment, the replacement chip includes a copy of the data on the chip being replaced. In another embodiment, the replacement chip includes exclusive OR ("XOR") of data written to each chip arranged in an array wherein data from each chip in the array is accessed in parallel.

In another embodiment, the replacement chip includes data that is derived from a parity stripe. In this embodiment, the solid-state storage device 102 includes storage devices in a redundant array of independent drives ("RAID") and the replacement data is generated using the parity stripe data and data on other devices in the RAID. In another embodiment, the chip replacement module 418 replaces a chip that is identified as having hard errors by the hard error detection module 416.

In another embodiment, the chip replacement module 418 replaces a portion of a chip, such as a die. In yet another embodiment, the chip replacement module 418 replaces more than one chip. In one embodiment, the chip replacement module 418 replaces one or more chips where soft errors occur at an unacceptable rate. Chip replacement for an array of solid-state storage elements is described in more detail in U.S. patent application Ser. No. 12/419,223, to David Flynn, et al., titled Apparatus, System, and Method for Bad Block Remapping, filed 5 May 2009, which is herein incorporated by reference. One of skill in the art will recognize other ways to identify hard errors, to determine when to replace a chip, and to replace a chip.

In one embodiment, the apparatus 400 includes a garbage collection recovery module 420 and an erase error retirement module 422. In the embodiment, the region retirement criteria include erase error criteria. Also in the embodiment, in determining that the data errors in a storage region satisfy a region retirement criteria, the storage region error module 306 marks an erase block that includes the storage region ready for garbage collection. The garbage collection recovery module 420 then performs a garbage collection operation on the erase block by first copying valid data from the erase block to a location in the solid-state storage device 102 where data is currently being written.

The garbage collection recovery module 420 then erases the erase block. The erasure may be done in a number of different ways. Typically, in NAND flash solid-state storage, a logic "1" is written to each bit of the erase block. In other embodiments, the erase block may be written multiple times with logic "1s" and "0s," may be written with a pattern, etc. One of skill in the art will recognize other ways to erase an erase block.

The garbage collection recovery module 420 then determines if any errors in at least the storage region within the erased block satisfy the erase error criteria. This may be accomplished by noting any errors in the erasure process. For example, if there are bits where a logic "1" is written but the bits remain logic "0" then an error may be noted. In particular, in one embodiment, the garbage collection recovery module 420 may determine if any errors exist in the storage region. In another embodiment, the storage region may be an erase block and the erase block may be retired. The erase block may include, for example, a PEB 314, multiple PEBs 314, an LEB 324, 352, etc. In one embodiment, the erase error criteria may be a threshold number of errors. The threshold number of errors may be applied to the erase block, the storage region, etc.

In the embodiment, if the garbage collection recovery module 420 determines that the errors in at least the storage region within the erase block satisfy the erase error criteria, the erase error retirement module 422 retires at least the storage region within the erase block. For example, the erase error retirement module 422 may retire only the storage region, the storage region and an adjacent storage region, the entire erase block, etc. If the storage region spans multiple erase blocks, the storage region error module 306 may mark multiple erase blocks that include the storage region ready for garbage collection, the garbage collection recovery module 420 may garbage collect the erase blocks and determine through testing, subsequent data reads, or with hardware faults from the erase operation of the erase blocks whether data errors satisfy an erase error criteria, and the erase error retirement module 422 may then retire one or more erase blocks or portions of one or more erase blocks.

In addition, the erase error retirement module 422 may then record a time indicator associated with retiring the storage region and may also record a location of the retired storage region. In one embodiment, the garbage collection process is triggered when the erase block is marked for garbage collection. In another embodiment, the garbage collection process operates autonomously from the marking the erase block ready for garbage collection and the erase block is recovered in due course. One of skill in the art will recognize other ways to use a garbage collection process to determine if a storage region should be retired.

In another embodiment, the apparatus 400 includes a program error module 424 and a program error retirement module 426. In the embodiment, the region retirement criteria include program error criteria. The program error criteria, in one embodiment, are associated with programming data into storage media. In the embodiment, the program error module 424 determines if errors resulting from programming storage cells within the solid-state storage media 110 satisfy the program error criteria. The program error module 424 determines program errors during a program operation, for example if hardware faults occur, such that hardware signals the program operation was unsuccessful. Alternatively, in one embodiment, the program error module 424 determines program errors at a later time, for example, when data that was programmed is read. If the program error module 424 determines that the errors resulting from programming the storage media satisfy the program error criteria, the program error retirement module 426 retires at least one storage region that includes the hardware media associated with the programmed storage media.

The program error retirement module 426 may also record a time indicator associated with retiring the storage region and may also record a physical location of the retired storage region. The time indicator and location may then be used by the storage region error module 306, the media error prediction module 404, and other modules discussed herein to analyze storage regions, identify errors, determine a rate of retiring storage regions, and the like. In another embodiment, a storage region that satisfies that program error criteria is marked for garbage collection and the garbage collection recovery module 420 may determine that the storage region qualifies for retirement or to be returned to pool of storage regions available for data storage.

In one embodiment, the apparatus 400 includes a verification module 428 that verifies that the storage region retired by the retirement module 308 is unreliable for storing data. The verification module 428, in one embodiment, marks the storage region for garbage collection and the garbage collection recovery module 420 performs a garbage collection operation on the storage region and determines if the storage region has data errors. In another embodiment, the verification module 428 re-reads data in the ECC chunk and the determination module 302, the threshold module 304, and the storage region error module 306 work together to determine if data from the ECC chunk has bits in error and if the storage region again meets the region retirement threshold. In another embodiment, the verification module 428 uses other hardware checking to determine if the storage region has data errors, In one embodiment, if the verification module 428 determines that the storage region continues to experience data errors that satisfy a region retirement criteria, the retirement module 308 retires the storage region. If the verification module 428 determines that the storage region is functioning normally, has a bit error count below the ECC chunk error threshold, passes a hardware check, or the like, the retirement module 308 may not retire the storage region and may instead make the storage region available for data storage. One of skill in the art will recognize other ways for the verification module 428 to verify that a storage region that satisfies a region retirement criteria is ready for retirement or if the storage region may be reconditioned, retested, etc. and then made available for data storage.

In a further embodiment, the verification module 428 allows data storage in the storage region subsequent to the storage region error module 306 determining that the storage region satisfies the region retirement criteria. For example, the verification module 428 may verify that the storage region is suitable for data storage, even though initially the retirement module may have retired the storage region. Those of skill in the art recognize that re-using a previously retired storage region may be useful in certain circumstances. For example, if a non-volatile solid state storage device is nearing its end of life period, the region retirement criteria may be dynamically adjusted (by a controller or a user) to permit a previously retired storage region to now fail to satisfy the newly set region retirement criteria. Consequently, the previously retired storage region may be brought back on-line, or into active use once again, or marked available for active use. In another embodiment, the previously retired storage region may be brought back into active use with an indicator that the previously retired storage region was previously retired.

In another embodiment, the verification module 428 returns the storage region to a non-retired state or prevents the storage region from being retired when the storage region has data errors, has a partial hardware failure affecting some bits in the storage region, has a bit error count that satisfies the ECC chunk error threshold, and the like. In this example, the storage region may be needed even though some errors are likely to recur. For example, the storage region may be needed until a storage element 312 is replaced, during a critical time when the solid-state storage device 102 cannot be offline, etc. Beneficially, using a robust ECC algorithm that can correct a relatively large number of bits in error allows a storage region to be used in cases where a high bit error count is present but the bit errors are correctable. One of skill in the art will recognize other times when the verification module 428 may override the retirement module 308 and keep a storage region available for data storage.

Beneficially, the apparatus 400 solves problems associated with the prior art and provides a way to identify and classify errors in a storage region and to retire storage regions before uncorrectable errors occur. The apparatus 400 provides a way to distinguish between soft and hard errors and to predict when the solid-state storage device 102 may fail, probability of failure, when to retire the solid-state storage device 102, and the like.

Flow Charts

Figure 5:
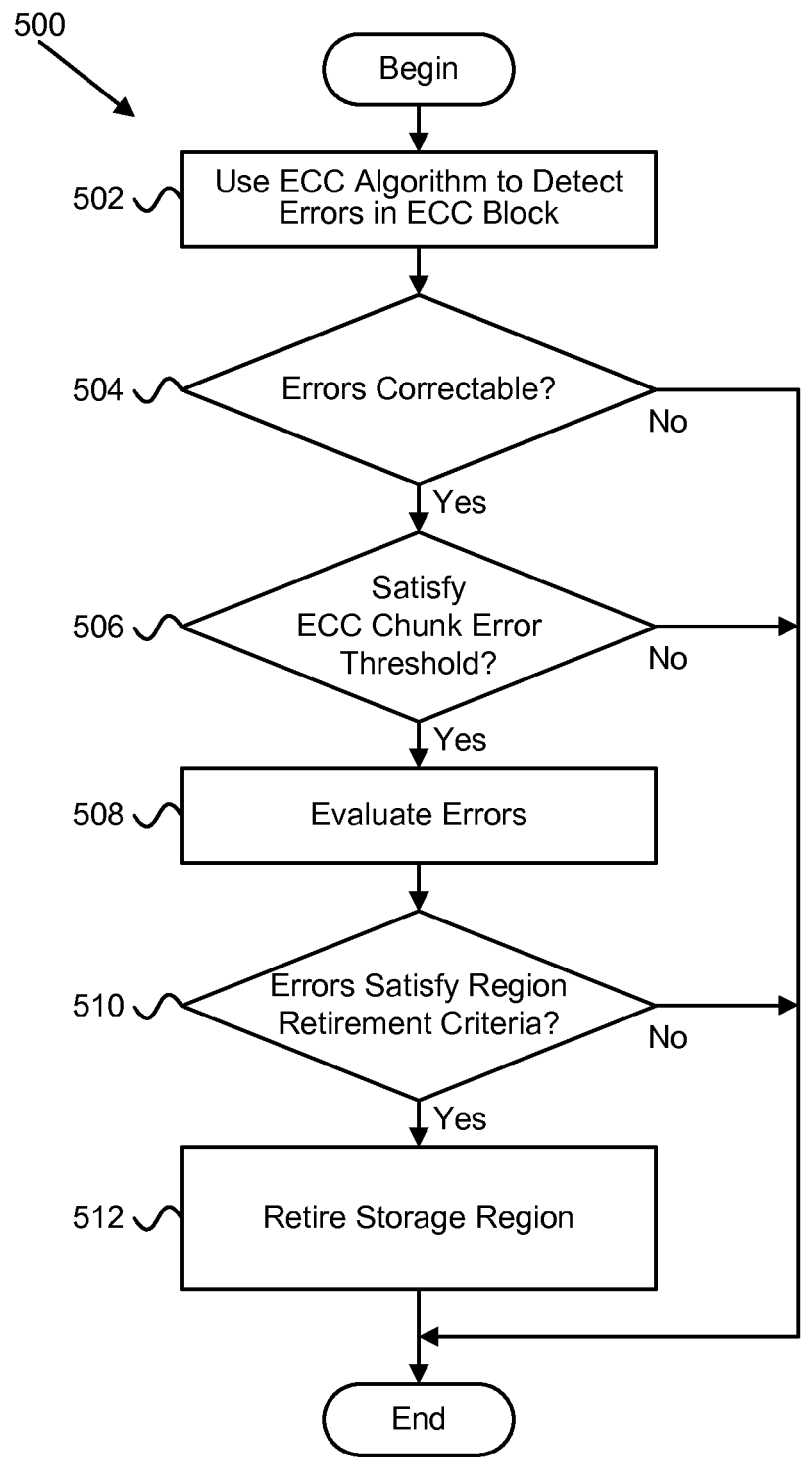
FIG. 5 is a schematic flow chart diagram illustrating one embodiment of a method for predicting failures in solid-state storage in accordance with the present invention.

FIG. 5 is a schematic flow chart diagram illustrating one embodiment of a method 500 for predicting failures in solid-state storage media 110 in accordance with the present invention. The method 500 begins and the solid-state storage controller 104 detects 502 errors in an ECC chunk by using ECC. The determination module 302 determines 504 if data that is stored in an ECC chunk and that contains errors includes a number of errors that are correctable using ECC. If the determination module 302 determines 504 that the errors are not correctable, the method 500 ends. The solid-state storage controller 104 may then take steps to notify a user or host system, replace at least a portion of the storage region and to restore data in the ECC chunk, storage region, etc.

If the ECC module 310 determines 504 that the number of errors in the ECC chunk is such that the errors are correctable, the threshold module 304 determines 506 if the bit error count of the ECC chunk satisfies an ECC chunk error threshold. If the threshold module 304 determines 506 that the bit error count of the ECC chunk does not satisfy the ECC chunk error threshold, the method 500 ends. The ECC module 310 then corrects the errors and the data is sent to a requesting device.

If the threshold module 304 determines 506 that the number of errors in the data stored in the ECC chunk satisfies the ECC chunk error threshold, the storage region error module 306 evaluates 508 the errors and determines 510 if data errors within a storage region satisfy a region retirement criteria. The storage region includes at least a portion of the ECC chunk that includes the detected errors. In another embodiment, the storage region includes the entire ECC chunk. If the storage region error module 306 determines 510 that data errors within a storage region do not satisfy a region retirement criteria, the method 500 ends. The region retirement criteria may include a simple threshold, an error rate, or may include more complex analysis. Several methods of determining if the errors in the ECC chunk satisfy the region retirement criteria are discussed above.

If the storage region error module 306 determines 510 that data errors within a storage region satisfy a region retirement criteria, the retirement module 308 retires 512 the storage region that includes the ECC chunk, and the method 500 ends. The retired storage region is no longer used to store data, but may be recovered in a recovery operation. A recovery operation may retest the retired storage region for errors and may return the retired storage region to a non-retired state for data storage if data errors are not present or are deemed acceptable, or may maintain the retired storage region in a retired state if retesting confirms hard errors, finds additional faults or bit errors, etc.

Figure 6:
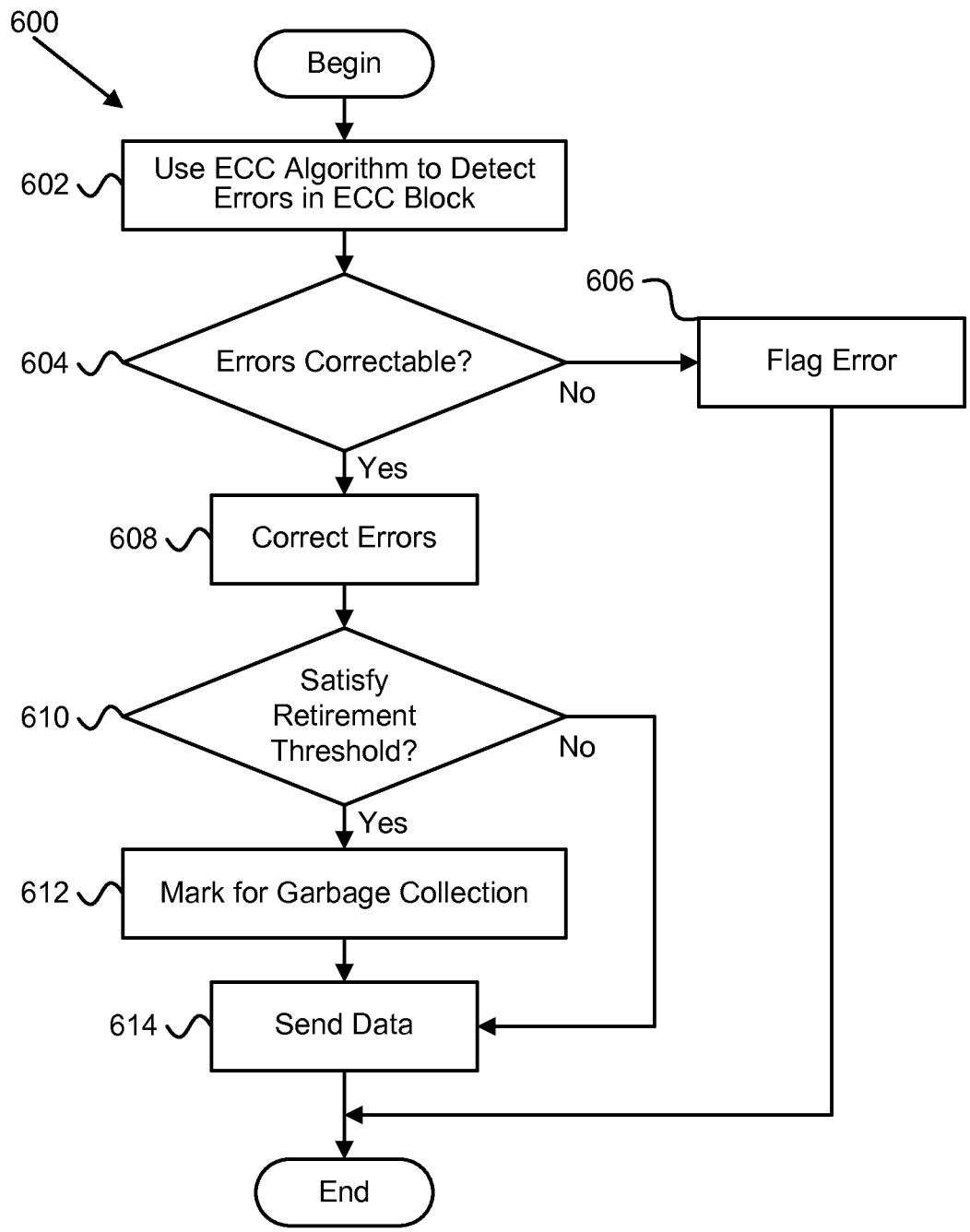
FIG. 6 is a schematic flow chart diagram illustrating an alternate embodiment of a method for predicting failures in solid-state storage using garbage collection in accordance with the present invention.

FIG. 6 is a schematic flow chart diagram illustrating an alternate embodiment of a method 600 for predicting failures in solid-state storage media 110 using garbage collection in accordance with the present invention. The method 600 begins and the ECC module 310 detects 602 errors in an ECC chunk by using ECC stored with the data and an ECC algorithm. The determination module 302 determines 604 if data that is stored in an ECC chunk and that contains errors includes a number of errors that are correctable using an ECC algorithm. If the determination module 302 determines 604 that the errors are not correctable, the solid-state storage controller 104 flags 606 an error. The solid-state storage controller 104 may then retire the ECC chunk, replace a chip in error, retrieve data stored in the ECC chunk and other adjacent storage, or other corrective action.

If the determination module 302 determines 604 that the errors are correctable, the ECC module 310 may correct 608 the errors. The threshold module 304 determines 610 if the bit error count of the ECC chunk satisfies an ECC chunk error threshold. If the threshold module 304 determines 610 that the bit error count of the ECC chunk does not satisfy the ECC chunk error threshold, the solid-state storage controller 104 sends 614 the data to a requesting device, such as a client 114, and the method 600 ends.

If the threshold module 304 determines 610 that the bit error count of the ECC chunk satisfies an ECC chunk error threshold, the storage region error module 306 marks 612 an erase block that includes the ECC chunk ready for garbage collection and the solid-state storage controller 104 sends 614 the data to a requesting device, and the method 600 ends. The method 600 described in relation to FIG. 6 is intended to be coupled with the garbage collection method 700 described in relation to FIG. 7. As mentioned above, the garbage collection method 700 may run autonomously from the method 600 of FIG. 6 or may be initiated in response to the storage region error module 306 marking 612 the erase block ready for garbage collection.

Figure 7:
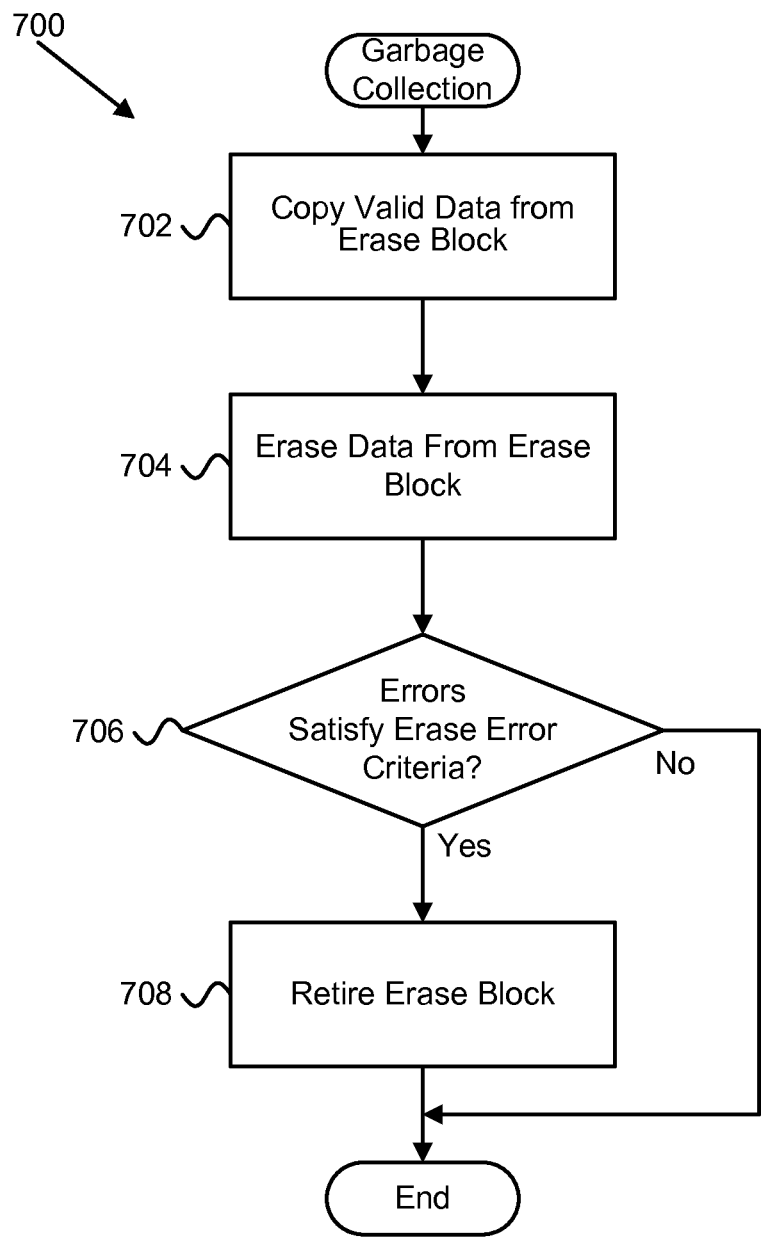
FIG. 7 is a schematic flow chart diagram illustrating one embodiment of a garbage collection method in accordance with the present invention.

FIG. 7 is a schematic flow chart diagram illustrating one embodiment of a garbage collection method 700 in accordance with the present invention. The garbage collection method 700 begins and the garbage collection recovery module 420 copies 702 valid data from the erase block marked for garbage collection to another location. In one embodiment, the data is written to a location in the solid-state storage device 102 where data is currently being written. For example, where the solid-state storage device 102 is a sequential storage device, the data may be copied 702 to a current append point.

The garbage collection recovery module 420 then erases 704 data from the erase block and then determines 706 if errors in at least the storage region within the erase block satisfy the erase error criteria. If the garbage collection recovery module 420 determines 706 that errors in at least the storage region within the erase block do not satisfy the erase error criteria, the method 700 ends. For example, if errors detected in the ECC chunk were soft errors, caused for example by the read disturb phenomenon, there may not be enough errors or may not be any errors after erasure of the erase block to satisfy the erase error criteria and the storage region in the erase block may not need to be retired.

If the garbage collection recovery module 420 determines 706 that errors in at least the storage region within the erase block satisfy the erase error criteria, the erase error retirement module 422 retires 708 at least the storage region determined by the storage region error module 306 to satisfy the region retirement criteria, and the method 700 ends. The erase error retirement module 422 may also retire the entire erase block with errors or may retire only a portion of the erase block. The erase error retirement module 422 may also record a location of the retired storage and may record a time indicator associated with retiring the retired storage. In another embodiment, the chip replacement module 418 replaces a chip with the retired storage region.

Figure 8:
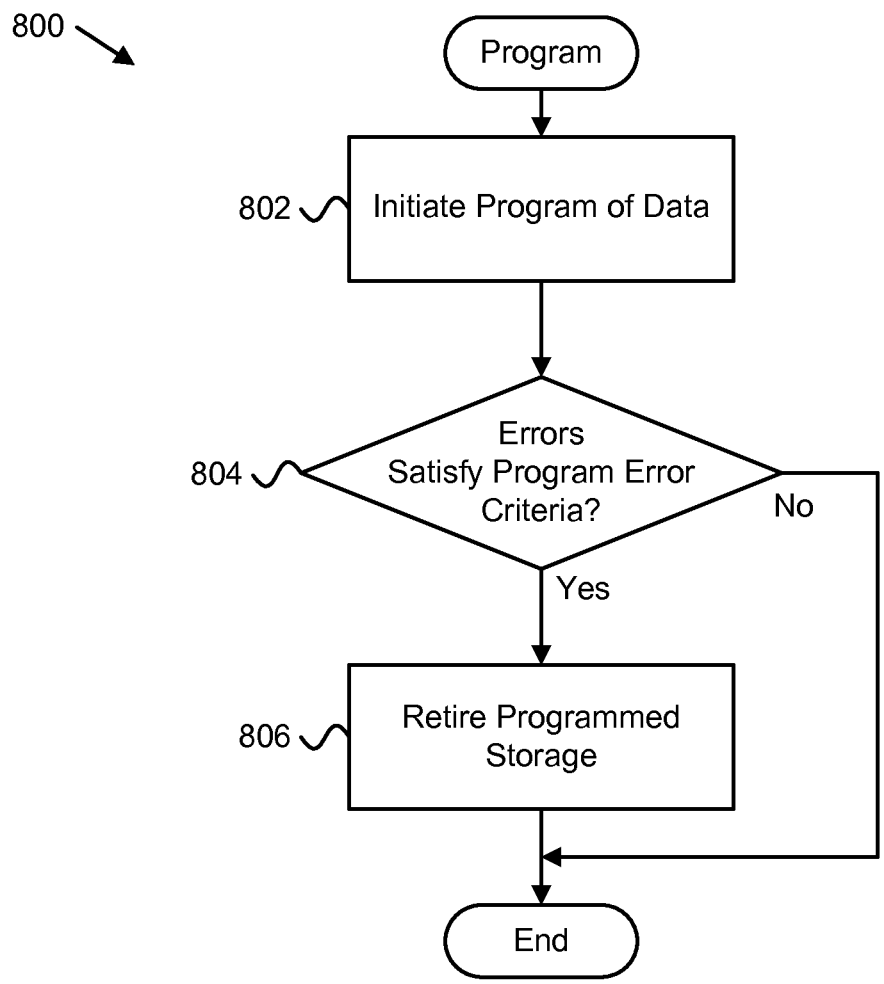
FIG. 8 is a schematic flow chart diagram illustrating one embodiment of a program operation method in accordance with the present invention.

FIG. 8 is a schematic flow chart diagram illustrating one embodiment of a program or write operation method 800 in accordance with the present invention. The program or write operation method 800 begins and the solid-state storage controller 104 initiates 802 programming or writing of data into the solid-state storage media 110. For example, the solid-state storage controller 104 may program data into a page within an erase block in the solid-state storage media 110 or in a logical page.

The program error module 424 determines 804 if errors resulting from programming or writing data to storage media within the solid-state storage satisfy the program error criteria. If the program error module 424 determines 804 that errors resulting from programming or writing data to storage media within the solid-state storage do not satisfy the program error criteria, the method 800 ends. If the program error module 424 determines 804 that errors resulting from programming storage within the solid-state storage satisfy the program error criteria, the program or write error retirement module 426 retires 806 at least a storage region within the programmed storage. In another embodiment, the program error retirement module 426 retires 806 a PEB 314, an LEB 324, 352, etc.

In another embodiment, the program error retirement module 426 may record a location of the retired storage and may record a time indicator associated with retiring the storage. In another embodiment, the chip replacement module 418 replaces a chip with the retired storage region. The location and time indicators of the storage retired by the program error retirement module 426 may be used by the media error prediction module 404 to determine when a storage region retirement rate is unacceptable.

Figure 9:
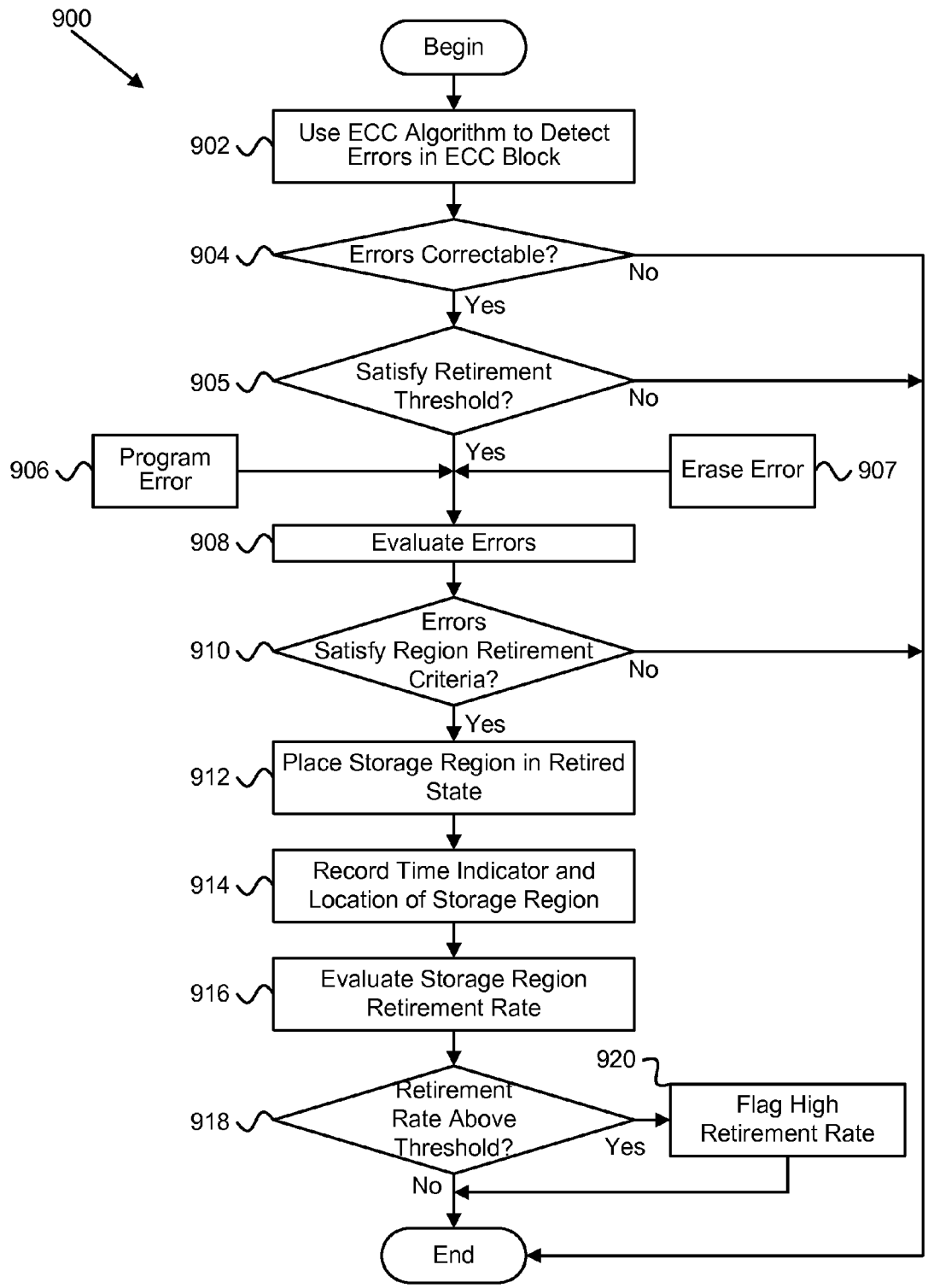
FIG. 9 is a schematic flow chart diagram illustrating another alternate embodiment of a method for predicting failures in solid-state storage in accordance with the present invention.

FIG. 9 is a schematic flow chart diagram illustrating another alternate embodiment of a method 900 for predicting failures in solid-state storage in accordance with the present invention. The method 900 begins and the ECC module 310 detects 902 errors in an ECC chunk by using ECC stored in the ECC chunk and an ECC algorithm. The determination module 302 determines 904 if data that is stored in an ECC chunk and that contains errors includes a number of errors that are correctable using the ECC stored with the data and an ECC algorithm. If the determination module 302 determines 904 that the errors are not correctable, the method 900 ends.

If the determination module 302 determines 904 that the bit error count of the ECC chunk is such that the errors are correctable, the threshold module 304 determines 905 if the bit error count of the ECC chunk satisfies an ECC chunk error threshold. If the threshold module 304 determines 905 that the bit error count of the ECC chunk does not satisfy the ECC chunk error threshold, the method 900 ends.

If the threshold module 304 determines 905 that the bit error count of the ECC chunk satisfies the ECC chunk error threshold, the storage region error module 306 evaluates 908 the errors. The storage region includes at least a portion of the ECC chunk where the portion of the ECC chunk includes errors. In addition, if the program error module 424 or the garbage collection recovery module 420 or other erase module determines 906, 907 that the storage region has data errors, the storage region error module 306 evaluates 908 the errors. The storage region error module 306 then determines 910 if data errors within a storage region satisfy a region retirement criteria. If the storage region error module 306 determines 910 that data errors within a storage region do not satisfy a region retirement criteria, the method 900 ends.

If the storage region error module 306 determines 910 that data errors within a storage region satisfy a region retirement criteria, the retirement module 308, in one embodiment, places 912 the storage region that includes the ECC chunk into a retired state. In another embodiment, the storage region error module 306 determines if a disturb count associated with the storage region satisfies a disturb threshold and if so, the retirement module 308 maintains the storage region in a non-retired state. The error logging module 402 records 914 a time indicator associated with when the storage region error module 306 determined that errors in the storage region met the region retirement criteria and error logging module 402 records 914 a location of the retired storage region. In an alternate embodiment, the garbage collection recovery module 420 performs a garbage collection operation on the storage region. If the storage region continues to experience data errors, the retirement module 308 retires the storage region. If the storage region does not experience data errors, the storage region is returned, in one embodiment, to a pool of storage regions available for data storage. One of skill in the art will also recognize other ways to retest, reclaim or recover a storage region that satisfies a region retirement criteria.

The media error prediction module 404 evaluates 916 the storage region retirement rate. The evaluation 916 may occur after retirement of a storage region, may be triggered by another event, such as garbage collection, may occur according to a schedule, etc. The media error prediction module 404 may evaluate 916 the storage region retirement rate using information recorded 914 by the error logging module 402 or other source to determine the region retirement rate. In the embodiment, the media error prediction module 404 determines 918 if the region retirement rate satisfies a predefined threshold. If the media error prediction module 404 determines 918 that the region retirement rate fails to satisfy a predefined threshold, for example, not above a storage retirement rate threshold, the method 900 ends.

If the media error prediction module 404 determines 918 that the region retirement rate is too high, for example above a region retirement rate threshold, the media error prediction module 404 flags 920 the storage region retirement rate and the method 900 ends. The media error prediction module 404 may use a limit, curve fitting, rules, heuristics, and/or the like to determine 918 that the error rate is too high. The media error prediction module 404 may flag 920 the rate using an error message or similar means and appropriate action may be taken as a result, such as retiring the solid-state storage device 102, copying data from the solid-state storage device 102, etc.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. An apparatus to determine non-volatile solid-state storage media status, the apparatus comprising:
    a determination module configured to (a) determine that data stored in an Error Correcting Code ("ECC") chunk contains ECC correctable errors, and (b) determine a bit error count for the ECC chunk read from non-volatile solid-state storage media;
    a threshold module configured to determine if the bit error count satisfies an ECC chunk error threshold;
    a storage region error module configured to determine if a storage region that contains at least a portion of the ECC chunk satisfies region retirement criteria, the storage region comprising a first portion on a first solid-state storage die and a second portion on a second solid-state storage die;
    a retirement module configured to retire the first and second portions of the storage region on the first and second solid-state storage dies in parallel in response to the storage region containing at least a portion of the ECC chunk and satisfying the region retirement criteria; and
    a verification module configured to verify that at least one of the first and second portions of a previously retired storage region is suitable for data storage and allow re-use of the at least one of the first and second portions of the previously retired storage region;
    wherein the determination module, the threshold module, the storage region error module, the retirement module, and the verification module comprise one or more of logic hardware and executable code, the executable code stored on a non-transitory computer readable medium.

2. The apparatus of claim 1, wherein the ECC chunk error threshold comprises a bit error count that satisfies an acceptable error threshold and is below a maximum number of ECC correctable errors for the ECC chunk.

3. The apparatus of claim 1, further comprising an error logging module configured to record an identifier associated with the ECC chunk having the bit error count that satisfies the ECC chunk error threshold and a time indicator associated with determining the bit error count.

4. The apparatus of claim 1, further comprising:
    a media error prediction module configured to monitor a storage region retirement rate; and a retirement limit module configured to determine if the storage region retirement rate satisfies a storage region retirement threshold and sends a notification when the storage region retirement rate satisfies the storage region retirement threshold.

5. The apparatus of claim 1, wherein the storage region retired by the retirement module spans media elements of an array of solid-state storage elements such that each element includes a portion of the storage region and the portions of the storage region are accessed in parallel.

6. The apparatus of claim 1, wherein
the non-volatile solid-state storage media comprises a plurality of solid-state memory elements arranged in a two-dimensional array, each element comprising a plurality of physical erase blocks ("PEBs"), a group of PEBs comprising a logical erase block ("LEB") wherein each LEB comprises at least one PEB from each solid-state memory element and the storage region comprises an LEB;
data is stored in a logical page, the logical page comprising a physical page in each PEB within an LEB; and
an ECC chunk comprises at least a portion of data from each physical page in a logical page.

7. The apparatus of claim 1, wherein the storage region comprises one or more of an ECC chunk, a plurality of ECC chunks, a logical page spanning a plurality of solid-state storage chips, a LEB, a chip, a row of chips, and a column of chips.

8. The apparatus of claim 1, wherein the region retirement criteria further comprises determining if a storage region satisfies region retirement criteria based on one or more data errors associated with the storage region wherein the one or more data errors are detected during one or more of a read operation, an erase operation, and a program operation.

9. The apparatus of claim 1, further comprising a verification module configured to verify that the storage region retired by the retirement module is unreliable for storing data.

10. The apparatus of claim 1, wherein the region retirement criteria comprise disturb criteria including one or more of a read count and a program count for the storage region, the retirement module configured to allow the storage region to remain in service in a non-retired state in response to the storage region satisfying the disturb criteria.

11. The apparatus of claim 10, wherein the storage region error module is configured to mark the storage region having one of a read count and a program count that satisfies the disturb threshold.

12. The apparatus of claim 1, wherein the first portion of the storage region comprises the ECC chunk.

13. The apparatus of claim 12, further comprising a computer in communication with the solid-state storage device over one of a bus and a computer network.

14. A method for determining solid-state storage device status, the method comprising:
determining that data stored in an Error Correcting Code ("ECC") chunk contains ECC correctable errors;
determining a bit error count for the ECC chunk, the ECC chunk read from non-volatile solid-state storage media;
determining if the bit error count satisfies an ECC chunk error threshold;
determining if a storage region that contains at least a portion of the ECC chunk satisfies region retirement criteria, the storage region comprising a first portion on a first solid-state storage die and a second portion on a second solid-state storage die;
retiring the first and second portions of the storage region on the first and second solid-state storage dies together in response to the storage region containing at least a portion of the ECC chunk and satisfying the region retirement criteria;
verifying that at least one of the first and second portions of a previously retired storage region is suitable for data storage; and
allowing re-use of the at least one of the first and second portions of the previously retired storage region.

15. The method of claim 14, wherein the ECC chunk error threshold comprises a bit error count that satisfies an acceptable error threshold and is below a maximum number of ECC correctable errors for the ECC chunk.

16. The method of claim 14, further comprising recording a time indicator associated with determining the bit error count and recording an identifier for the ECC chunk having the bit error count that satisfied the ECC chunk error threshold.

17. The method of claim 14, further comprising determining if a storage region retirement rate satisfies a storage region retirement threshold, the storage region retirement rate determined from recorded time indicators associated with each retirement of a storage region.

18. The method of claim 14, further comprising incrementing a disturb counter for a storage region for one or more of each read operation and each program operation of the storage region, wherein a retirement region satisfying region retirement criteria is not retired in response to the disturb counter for the storage region satisfying a disturb threshold.

19. An apparatus for retiring a storage region, the apparatus comprising:
an error module configured to determine that a storage region has one or more data errors, the storage region comprising non-volatile solid-state storage;
a storage region error module configured to determine if the storage region determined to have one or more data errors by the error module satisfies region retirement criteria;
a retirement module configured to retire the storage region in response to the storage region satisfying the region retirement criteria; and
a verification module configured to verify that a previously retired storage region is suitable for data storage and allow re-use of the previously retired storage region;
wherein the error module, the storage region error module, the retirement module, and the verification module comprise one or more of logic hardware and executable code, the executable code stored on a non-transitory computer readable medium.

20. The apparatus of claim 19, further comprising a retry module configured to verify that a retired storage region has one or more data errors, the storage region originally retired by the retirement module based on a reported hardware error for the storage region.

21. The apparatus of claim 20, wherein the retry module is configured to determine if a storage region has one or more data errors by using a garbage collection operation, the garbage collection operation comprising at least performing an erase operation on the storage region and detecting one or more data errors during the erase operation.

22. An apparatus, comprising:
a determination module configured to identify Error Correcting Code ("ECC") correctable bit errors in storage regions of a solid-state storage medium;
a disturb counter module configured to track storage operations performed on the storage regions; and
a storage region retirement module configured to retire a storage region of the solid-state storage medium based at least in part on bit errors identified within the storage region and a disturb count of storage regions adjacent to the storage region;

wherein the determination module, the disturb counter module, and the storage region retirement module comprise one or more of logic hardware and executable code, the executable code stored on a non-transitory computer readable medium.

23. The apparatus of claim 22, wherein the storage region retirement module is configured to allow a storage region that satisfies a retirement threshold to remain in service in a non-retired state in response to an adjacent storage region satisfying a disturb threshold.

24. The apparatus of claim 22, wherein the storage region retirement module is configured to retire a storage region in response to determining that the storage region satisfies a retirement threshold and that the adjacent storage regions fail to satisfy a disturb threshold.

25. An apparatus, comprising:
- a retirement module configured to retire a storage region of a solid-state storage medium in response to determining that the storage region satisfies a region retirement threshold; and
- a verification module configured to verify that a portion of the retired storage region is suitable for data storage and to allow reuse of the portion of the retired storage region by combining the portion of the retired storage region with a portion of a separate storage region to create a new storage region;
- wherein the retirement module and the verification module comprise one or more of logic hardware and executable code, the executable code stored on a non-transitory computer readable medium.

26. The apparatus of claim 25, wherein the verification module is configured to verify that the retired storage region is suitable for data storage in response to an adjusted region retirement threshold.

27. The apparatus of claim 26, wherein the verification module is configured to identify the storage region as a previously retired storage region.

28. The apparatus of claim 25, wherein the verification module is configured to test the retired storage region to determine that the retired storage region is suitable for data storage.

29. The apparatus of claim 25, wherein each storage region is a logical erase block comprising a plurality of physical erase blocks, wherein combining the portion of the retired storage region with the portion of the separate storage region to create the new storage region comprises combining a first physical erase block from a retired first logical erase block with at least a second physical erase block from a retired second logical erase block to create a usable logical erase block.

30. An apparatus, comprising:
- a retirement module configured to retire a storage region of a solid-state storage medium in response to determining that the storage region satisfies a region retirement threshold based on a number of data errors in the storage region; and
- a media error prediction module configured to monitor a storage region retirement rate, the storage region retirement rate comprising a ratio of a number of storage regions retired per unit of time;
- wherein the retirement module and the media error prediction module comprise one or more of logic hardware and executable code, the executable code stored on a non-transitory computer readable medium.

31. The apparatus of claim 30, wherein the media error prediction module is configured to determine an expected life of the solid-state storage medium based on the storage region retirement rate.

32. The apparatus of claim 30, wherein the media error prediction module is configured to determine a probability that the solid-state storage medium will be operable for at least a predefined length of time.

* * * * *